US008932406B2

(12) United States Patent
Mitchell et al.

(10) Patent No.: US 8,932,406 B2
(45) Date of Patent: Jan. 13, 2015

(54) IN-SITU GENERATION OF THE MOLECULAR ETCHER CARBONYL FLUORIDE OR ANY OF ITS VARIANTS AND ITS USE

(71) Applicants: Glenn Mitchell, Longmont, CO (US); Ramkumar Subramanian, Fremont (IN); Carrie L. Wyse, Longmont, CO (US); Robert Torres, Jr., Parker, CO (US)

(72) Inventors: Glenn Mitchell, Longmont, CO (US); Ramkumar Subramanian, Fremont (IN); Carrie L. Wyse, Longmont, CO (US); Robert Torres, Jr., Parker, CO (US)

(73) Assignee: Matheson Tri-Gas, Inc., Basking Ridge, NJ (US)

( * ) Notice: Subject to any disclaimer, the term of this patent is extended or adjusted under 35 U.S.C. 154(b) by 38 days.

(21) Appl. No.: 13/831,613

(22) Filed: Mar. 15, 2013

(65) Prior Publication Data
US 2014/0060571 A1    Mar. 6, 2014

Related U.S. Application Data

(60) Provisional application No. 61/743,465, filed on Sep. 4, 2012.

(51) Int. Cl.
*C25F 1/00* (2006.01)
*B01J 19/08* (2006.01)
(Continued)

(52) U.S. Cl.
CPC .............. *B01J 19/087* (2013.01); *B01J 19/12* (2013.01); *B08B 7/00* (2013.01); *B01J 19/081*
(Continued)

(58) Field of Classification Search
CPC .......... B01J 19/087; B01J 19/12; B08B 7/00; B08B 5/00; B08B 5/02
USPC ............ 252/183.14, 372; 134/1, 1.1, 1.2, 1.3, 134/26, 37, 42; 216/67, 74, 79, 80; 438/706, 710, 718, 720, 723, 724
See application file for complete search history.

(56) References Cited

U.S. PATENT DOCUMENTS 5,648,530 A    7/1997  Webster
8,513,458 B2*  8/2013  Quan et al. .................... 562/851
(Continued)

FOREIGN PATENT DOCUMENTS

EP         1143498         12/2012
WO     WO2014/039425    *  3/2014

*Primary Examiner* — Bibi Carrillo

(57) ABSTRACT

The molecular etcher carbonyl fluoride ($COF_2$) or any of its variants, are provided for, according to the present invention, to increase the efficiency of etching and/or cleaning and/or removal of materials such as the unwanted film and/or deposits on the chamber walls and other components in a process chamber or substrate (collectively referred to herein as "materials"). The methods of the present invention involve igniting and sustaining a plasma, whether it is a remote or in-situ plasma, by stepwise addition of additives, such as but not limited to, a saturated, unsaturated or partially unsaturated perfluorocarbon compound (PFC) having the general formula ($C_yF_z$) and/or an oxide of carbon ($CO_x$) to a nitrogen trifluoride ($NF_3$) plasma into a chemical deposition chamber (CVD) chamber, thereby generating $COF_2$. The $NF_3$ may be excited in a plasma inside the CVD chamber or in a remote plasma region upstream from the CVD chamber. The additive(s) may be introduced upstream or downstream of the remote plasma such that both $NF_3$ and the additive(s) (and any plasma-generated effluents) are present in the CVD chamber during cleaning.

7 Claims, 27 Drawing Sheets

(51) Int. Cl.
*B01J 19/12* (2006.01)
*B08B 7/00* (2006.01)
*C01B 31/00* (2006.01)
*C23C 16/44* (2006.01)
*H01L 21/311* (2006.01)

(52) U.S. Cl.
CPC ........ (2013.01); *B01J 19/088* (2013.01); *B01J 19/123* (2013.01); *B01J 19/125* (2013.01); *B01J 19/126* (2013.01); *B01J 19/127* (2013.01); *B01J 19/128* (2013.01); *B01J 19/129* (2013.01); *C01B 31/00* (2013.01); *C23C 16/4405* (2013.01); *B01J 2219/0883* (2013.01); *B01J 2219/0892* (2013.01); *H01L 21/31116* (2013.01); *Y02C 20/30* (2013.01)

USPC ........... 134/1.1; 252/183.12; 252/372; 134/1; 134/1.2; 134/1.3; 134/26; 134/37; 134/42; 216/67; 216/74; 216/79; 216/80; 438/706; 438/710; 438/718; 438/720; 438/723; 438/724

(56) References Cited

U.S. PATENT DOCUMENTS

| | | | |
|---|---|---|---|
| 2004/0182415 A1* | 9/2004 | Yoon et al. | 134/1.2 |
| 2006/0194985 A1 | 8/2006 | Mitsui | |
| 2008/0110744 A1 | 5/2008 | Girard | |
| 2010/0191013 A1 | 7/2010 | Quan | |
| 2011/0056515 A1 | 3/2011 | Mitchell | |
| 2014/0060571 A1* | 3/2014 | Mitchell et al. | 134/1.1 |

* cited by examiner

IN-SITU GENERATION OF THE MOLECULAR ETCHER CARBONYL FLUORIDE OR ANY OF ITS VARIANTS AND ITS USE

CROSS REFERENCE TO OTHER APPLICATIONS

This application claims benefit of provisional U.S. Application No. 61/743,465, filed Sep. 4, 2012 the disclosure of which is fully incorporated herein by reference.

BACKGROUND OF THE INVENTION

The semiconductor industry has benefited from in-situ dry cleaning procedures made possible by exciting nitrogen trifluoride in a plasma and flowing the plasma effluents to clean interior surfaces of a substrate processing chamber. In-situ cleaning procedures avoid requiring chamber disassembly while still removing undesired substances such as silicon nitride, polycrystalline silicon, silicides and silicon dioxide. Removing these undesired substances before additional substrate processing may reduce defects and control electromechanical properties of processed layers.

Nitrogen trifluoride ($NF_3$), has been widely selected as a precursor to generate fluorine/fluorine radicals in-situ over the use of fluorine ($F_2$) as a direct result of its ease of handling and cost. The relatively high cost of nitrogen trifluoride combined with speculation that the agent has a high global warming potential (GWP), are causing manufacturers to look for ways to use less $NF_3$ per preventative maintenance procedure. Thus there is a need for new chamber cleaning agents which more effectively remove contaminants from the interior surfaces of substrate processing chambers and produce more eco-friendly exhaust gases.

Carbonyl Fluoride ($COF_2$) is an extremely reactive and toxic gas. Carbonyl Fluoride ($COF_2$) reacts with water (ubiquitous in the environment) to produce hydrogen fluoride, itself a toxic and corrosive gas, and carbon dioxide, and $COF_2$ is difficult to purify. Additionally, there are shelf life concerns in cylinder packaging for $COF_2$, thus yielding an unstable output that contains a variety of the above mentioned hazardous compounds that may not be fortuitous to a process. Fortunately, the precautions for safe storage, handling and use are well documented; however, the cost for implementing the measures is high versus less hazardous materials. The high cost of manufacture and distribution of carbonyl fluoride ($COF_2$) are also impacted by its hazardous properties. Combined, these two facts result in an integrated cost of ownership for implementing and using carbonyl fluoride ($COF_2$) that is commercially questionable. Especially cost prohibitive is retrofitting existing locations where carbonyl fluoride ($COF_2$) would provide a benefit. In the semiconductor, flat-panel and solar industries, nitrogen trifluoride ($NF_3$), oxides of carbon ($CO_x$ where x=1 or 2) and numerous perfluorocarbon compounds (CyFz) are already is use. Generating Carbonyl Fluoride ($COF_2$) in-situ from safer, familiar materials allows the technical benefits described herein to be attainable whilst reducing the infrastructure costs and time required to implement and avoids the need of supplying COF2 in a cylinder package.

BRIEF SUMMARY OF THE INVENTION $COF_2$ is highly reactive and unstable, and is a very good etch molecule to etch silicon and its compound films. Methods of generating carbonyl fluoride ($COF_2$) and it's variants in-situ are disclosed herein. The methods of the present invention involve igniting (also referred to herein as striking) and sustaining a plasma, whether it is a remote or in-situ plasma, by stepwise addition of additives, such as but not limited to, a saturated, unsaturated or partially unsaturated perfluorocarbon compound ($C_yF_z$) (PFC) and/or an oxide of carbon ($CO_x$) to a nitrogen trifluoride ($NF_3$) plasma into a chemical deposition chamber (CVD) chamber, thereby generating $COF_2$. The $NF_3$ may be excited in a plasma inside the CVD chamber or in a remote plasma region upstream from the CVD chamber. The additive(s) may be introduced upstream or downstream of the remote plasma such that both $NF_3$ and the additive(s) (and any plasma-generated effluents) are present in the CVD chamber during cleaning.

Embodiments of the invention include methods for the cleaning of deposition chambers in the Liquid Crystal Display (LCD), Flat Panel Display (FPD), semiconductor and related industries at a faster rate, with a secondary advantage of lowering emissions of high global warming potential (GWP) gases such as $NF_3$. The main 'etching' (interchangeable with 'cleaning' and/or 'chamber cleaning') component in this mixture/mixtures are fluorine/fluorine radical, formed by the remote plasma breakdown of $NF_3$, and the in-situ generated $COF_2$. The in-situ generation of $COF_2$ can be accomplished using a post remote plasma recombination of reactive species. Addition of additives such as, but not limited to saturated, unsaturated or partially unsaturated perfluorocarbon shaving the general formula ($C_yF_z$) such as, but not limited to, $C_3F_8$, $C_4F_8$, $C_2F_6$, and $C_4F_{10}$; oxygen or oxygen containing species such as, but not limited to, carbon monoxide, carbon dioxide, ozone, water, hydrogen peroxide ($H_2O_2$), hydrofluorinated ethers (HFEs), ethers, ketones, aldehydes, alcohols, carboxylic acids, organic acids (oxalic, acetic, etc.), carbonyls, etc.; and other fluorinated or halogenated species (i.e. $SF_6$, HF, etc.) to the remote plasma along with traditional chamber clean gas $NF_3$, results in the in-situ generation of $COF_2$, which acts as the additional etchant species.

Embodiments of the present invention will serve to enhance commercial processes based on improved quality of product due to better process control, and increase productivity and tool throughput due to reduced down time on process tools.

In addition, new cleaning gases and mixtures are presented that allow for the production of new chemical species that are readily formed in the cleaning process environments and can be removed by conventional vacuum processes. Addition of oxygen and oxygenated species along with intra-oxyhalogenated species are being considered for enhanced cleaning efficiency and cleaning rates.

Additional embodiments and features are set forth in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

Figure 1:
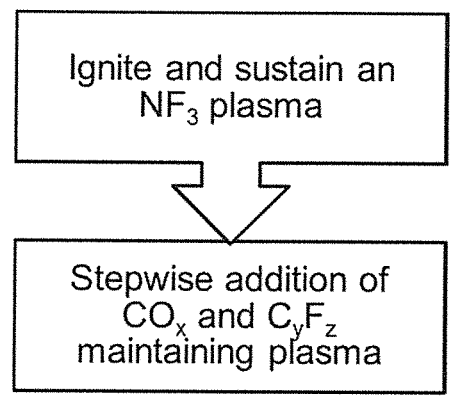
FIG. 1 is a flow chart of an $NF_3$ plasma initiation and subsequent introduction of additives.

In the appended figures, similar components and/or features may have the same reference label. Further, various components of the same type may be distinguished by following the reference label by a dash and a second label that distinguishes among the similar components. If only the first reference label is listed in the specification, the description is applicable to anyone of the similar components having the same first reference label irrespective of the second reference label.

DETAILED DESCRIPTION OF THE INVENTION

In the present invention the generation of COF$_2$ in-situ under specific process conditions described in detail below, prohibits and significantly reduces the post-plasma recombination formation of NF$_3$. This generates additional etchant species in COF$_2$, which is directly responsible for the enhanced cleaning rates and subsequent reduction in consumption of NF$_3$. In general, the chemistry should be in a mixture as illustrated by:

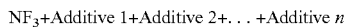

NF$_3$+Additive 1+Additive 2+...+Additive $n$ where n in a value from 1 to 10 and the additives are as follows: Examples of additive gases to form in-situ COF$_2$ are the following: Addition of saturated, unsaturated or partially unsaturated perfluorocarbons (PFCs) represented by the general formula, C$_y$F$_z$, such as, but not limited to C$_3$F$_8$, C$_4$F$_8$, C$_2$F$_6$, and C$_4$F$_{10}$; oxygen or oxygen containing species represented by the general formula (CO$_x$) such as carbon monoxide, carbon dioxide, ozone, water, hydrogen peroxide (H$_2$O$_2$), hydrofluorinated ethers (HFEs), ethers, ketones, aldehydes, alcohols, carboxylic acids, organic acids (oxalic, acetic, etc.), carbonyls, etc., and other fluorinated or halogenated species (i.e. SF$_6$, HF, etc.) to the remote plasma along with traditional chamber clean gas NF$_3$, results in the in-situ generation of COF$_2$, which acts as the additional etchant species. An additive can have the general formula of B$_w$H$_x$O$_y$A$_z$, where B=carbon (C), nitrogen (N), sulfur (S) or mixtures thereof; H=hydrogen; O=oxygen; and A=fluorine (F), chlorine (Cl), bromine (Br), or iodine (I) or mixtures thereof; and w, x, y, z are values from 0 to 30.

The molecular etcher carbonyl fluoride (COF$_2$) or any of its variants such as, but not limited to, COF$_2$, COF, OF$_2$, OF, F$_2$, F, NOF$_2$, and NOF, are provided for, according to the present invention, to increase the efficiency of etching and/or cleaning and/or removal of materials such as the unwanted film and/or deposits on the chamber walls and other components in a process chamber or substrate (collectively referred to herein as "materials"). Additionally, the generation of in-situ COF2 allows for the reduction of usage of NF$_3$, a high global warming potential gas, and this reduces the environmental impact (lowering emissions) of the chamber cleaning process. COF$_2$ can work together with the available fluorine and/or fluorine radical to make a combined cleaning chemistry that is more effective and efficient than just fluorine and/or fluorine radical alone, which is the typical process when NF$_3$ is used alone for this purpose.

Essentially, the present invention describes process technology developed for igniting (also referred to herein as striking) a plasma and sustaining the plasma for the cleaning process while and during the flow of the cleaning gases described above and below. This invention also describes the process conditions (i.e., residence time, pressure, flow conductance, etc.) and process tuning required to allow for the creation of in-situ COF$_2$ and have COF$_2$ becoming the dominant etching or cleaning species in the process in addition to the fluorine/fluorine radical. Lastly, this invention describes the technology developed for cleaning of substrate materials and/or deposition chambers in the Liquid Crystal Display (LCD), Flat Panel Display (FPD), semiconductor and related industries at a faster rate and includes all film types deposited by such processes.

In order to better understand and appreciate the invention, reference is now made to FIGS. 1-4, which are flow charts describing the steps of striking and sustaining a plasma using $NF_3$ and additive gasses to produce formation 2, as discussed in greater detail below.

Figure 2:
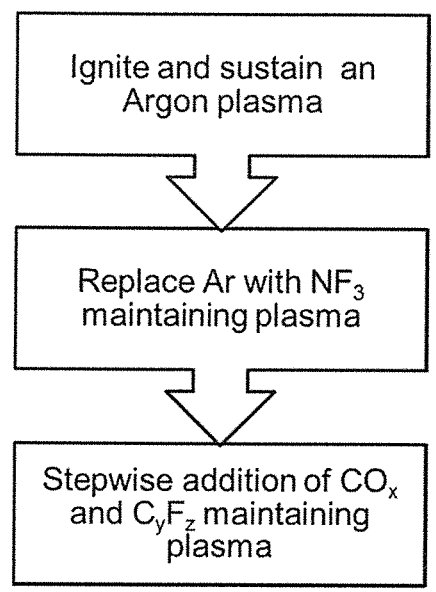
FIG. 2 is a flow chart of an argon plasma initiation, generation of an NF$_3$ plasma, cessation of Argon and subsequent introduction of additives.
Figure 5:
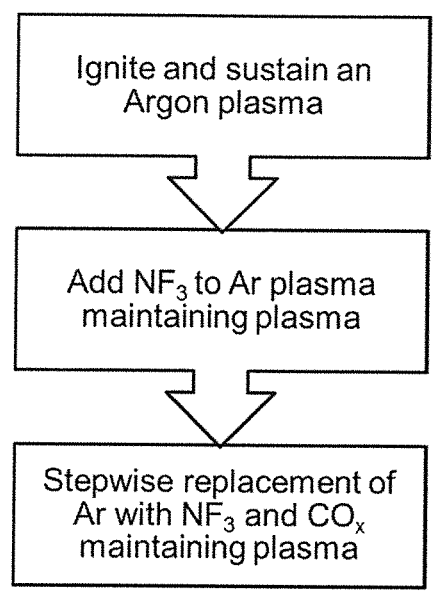
FIG. 5 is a flow chart of an Argon plasma initiation, addition of an Argon/NF$_3$ mixture subsequently replacing with a mixture of NF$_3$ and CO$_x$.
Figure 20:
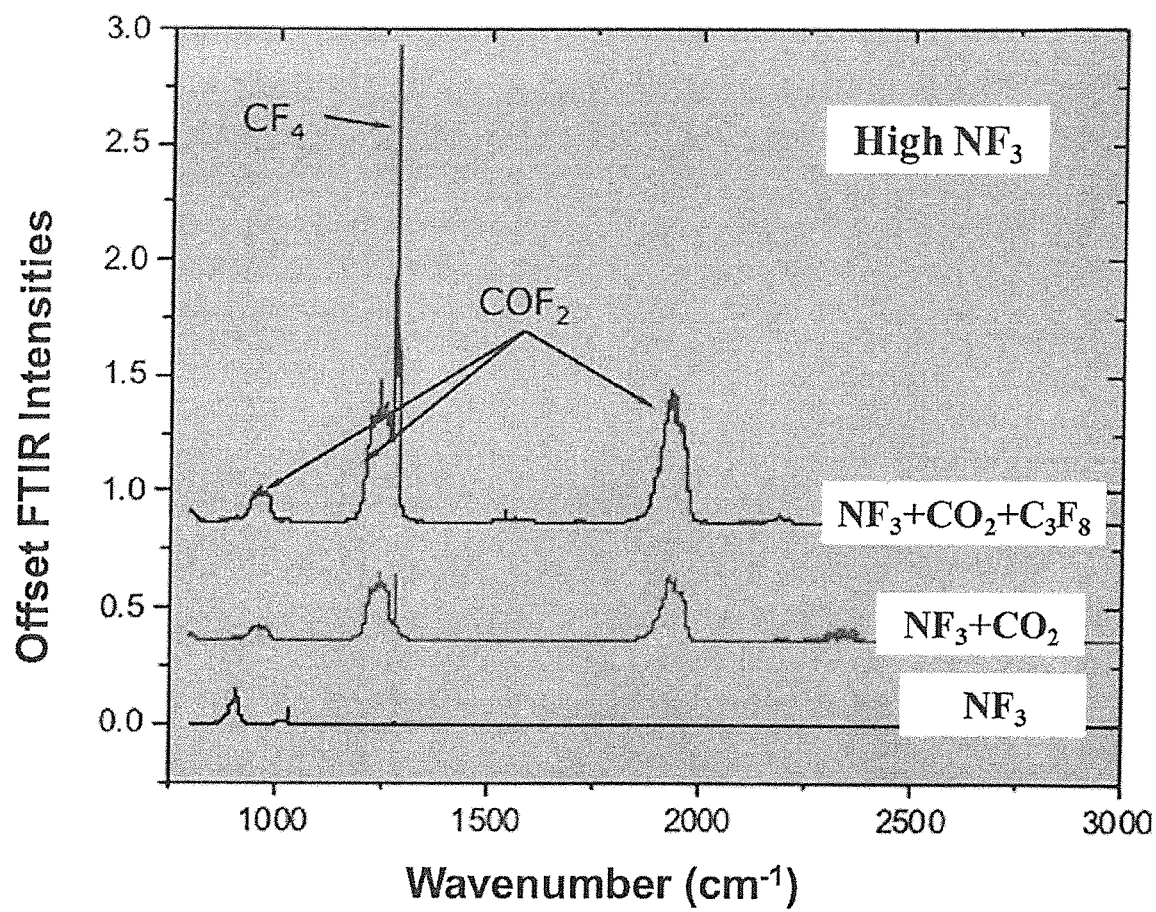
FIG. 20 provides FTIR data comparing Formulation 2 (top line), Formulation 1 (middle line) and pure NF$_3$ (bottom line) when NF$_3$ is high.
Figure 21A:
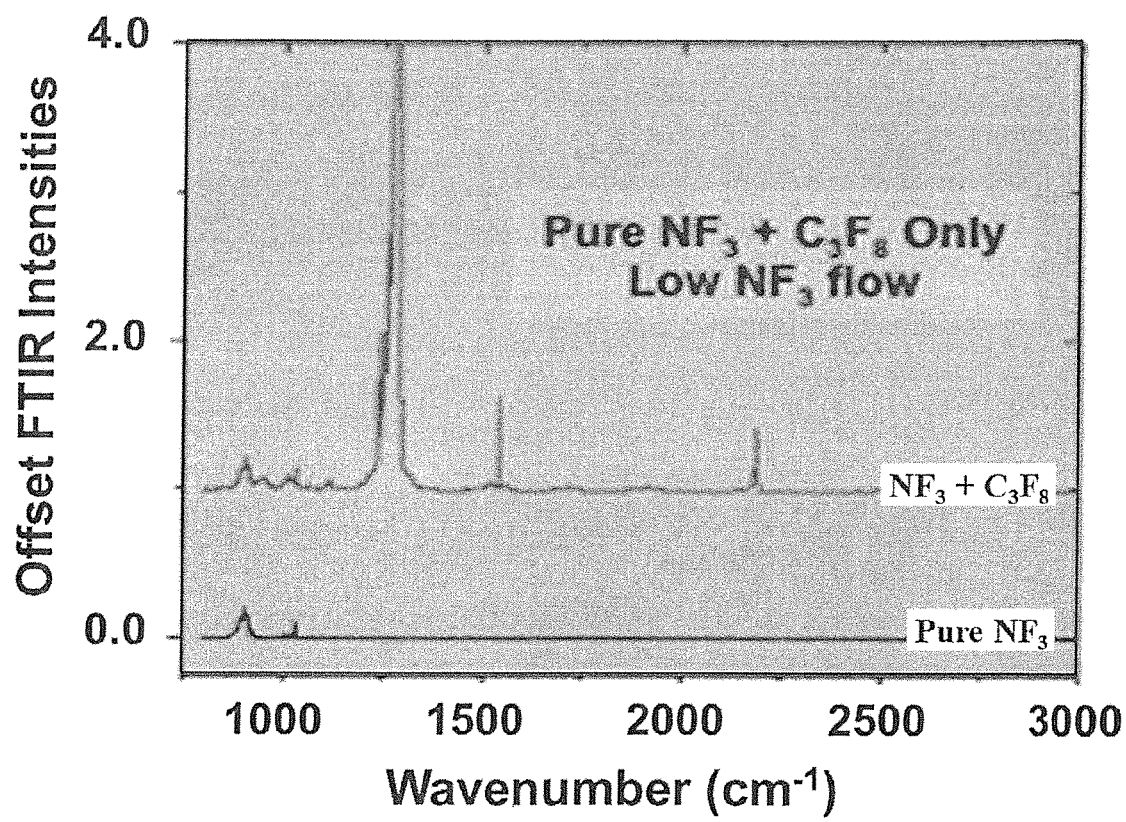
FIG. 21A provides FTIR data comparing pure NF$_3$ and PFC in a low NF$_3$ flow to data presented in FIGS. 21B and 21C.
Figure 21B:
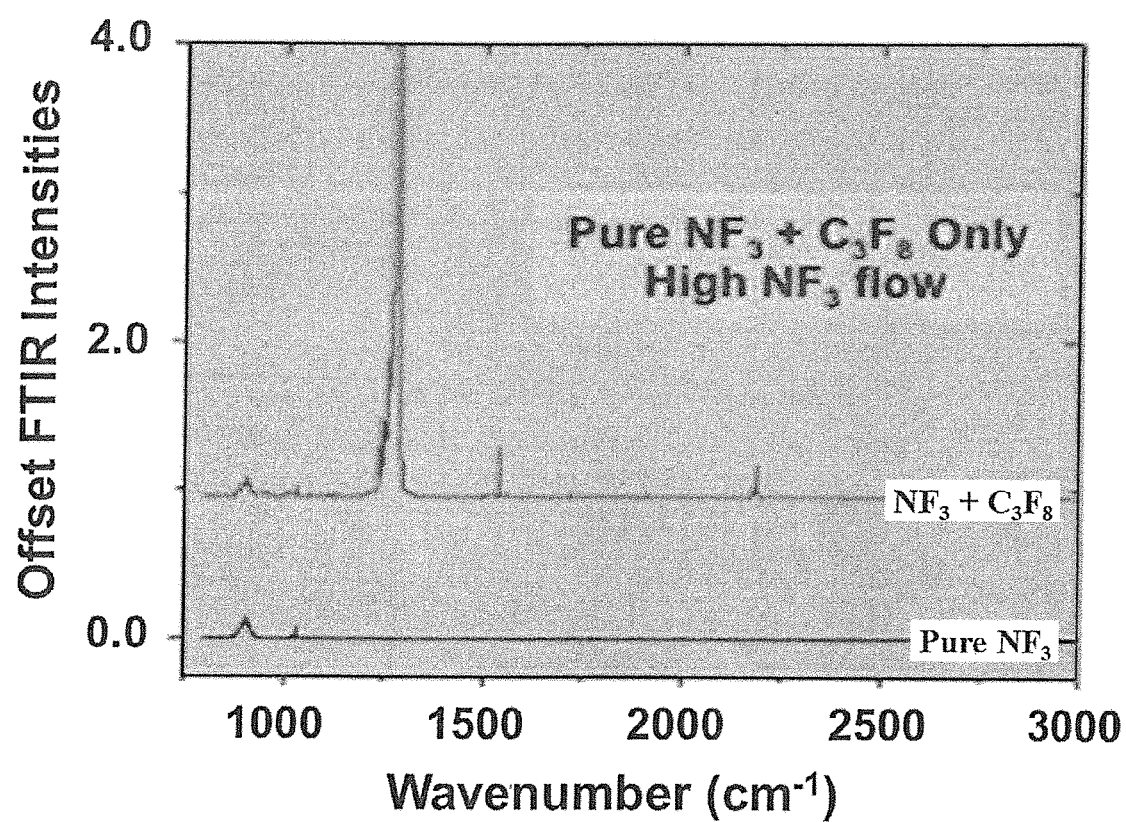
FIG. 21B provides FTIR data comparing pure NF$_3$ and PFC in a high NF$_3$ flow to data presented in FIGS. 21A and 21C.
Figure 21C:
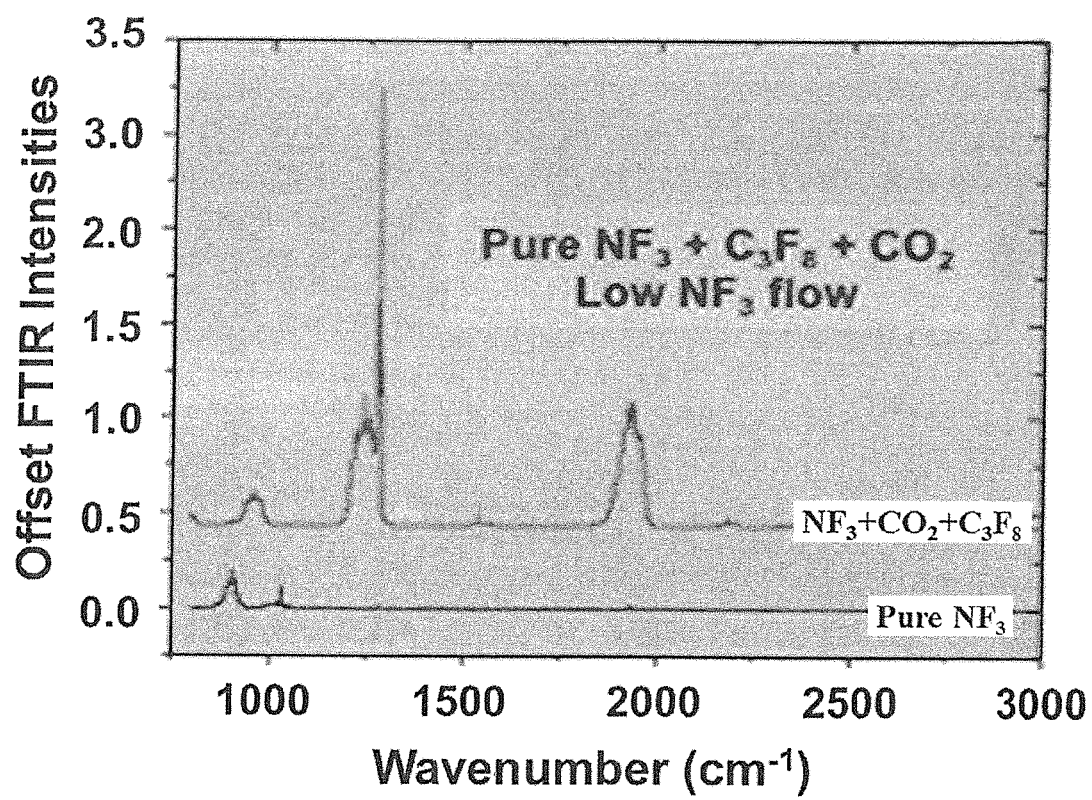
FIG. 21C provides FTIR data comparing pure NF$_3$ and PFC and CO$_2$ in a low NF$_3$ flow to data presented in FIGS. 21A and 21B.

Striking and Sustaining Plasma Using $NF_3$ and Additive Gases:

As mentioned above, a process of the present invention may be achieved by remote plasma ignition and stabilization. Igniting and sustaining a plasma by the stepwise addition one or more additives such as, but not limited to, an oxide of carbon ($CO_x$ wherein x has a value of 1-2) and a saturated, unsaturated or partially unsaturated PFC of formula $C_yF_z$ to an $NF_3$ plasma, as shown if FIG. 1. The correct ratio is critical to the working of the present invention. As shown in FIGS. 5, 20, and 21A critical concentrations of $COF_2$, necessary for etching/cleaning, is only generated upon achieving a specific ratios of $NF_3$ the oxide of carbon ($CO_x$ wherein x has a value of 1-2) and PFC additives. FIG. 2 demonstrates and alternative embodiment wherein a plasma is ignited in argon (Ar) and then $NF_3$ replaces the Ar to create an $NF_3$ plasma. The $NF_3$ flow is set to the desired flow, which is specific to each semiconductor process. An oxide of carbon ($CO_x$ wherein x has a value of 1-2) and a saturated, unsaturated or partially unsaturated PFC of formula $C_yF_z$ is gradually introduced in a stepwise fashion to the $NF_3$ plasma until the desired concentration and/or flow is reached, which again is specific to each semiconductor process. Additive gases such as $CO_2$ or CO in the remote plasma unit along with $NF_3$ undergo plasma dissociation. Subsequently, by recombination, $COF_2$ is generated in-situ of the etch chamber. $COF_2$ is highly reactive and unstable, and is a very good etch molecule to etch silicon and its compound films. The mechanism of enhancing the etch rate is discussed as follows for formulation 1 ($CO_2+NF_3$) and is not limited to information and mechanisms shown:

The chemistry involved in the plasma dissociation of pure $NF_3$ is listed below:

$$NF_3 \rightarrow N+3/2F_2$$

Without any additive gases, post-plasma, the recombination reaction is as follows:

$$N+3/2F_2 \rightarrow NF_3$$

$CO_2$, when used as additive, breaks down in the plasma as follows:

$$CO_2 \rightarrow CO+O$$

$$CO_2 \rightarrow C+2O$$

The in-situ generation chemistries post-plasma of $NF_3$ and $CO_2$ additive are listed below:

$$CO+F \rightarrow COF$$

$$COF+F \rightarrow COF_2$$

$$CO+F_2 \rightarrow COF_2$$

$$C+2F_2 \rightarrow CF_4$$

The primary post-plasma species generated is $COF_2$ and this particular embodiment is referred to herein as "Formulation 1" $CF_4$ is a minor component which may or may not enhance the etch/cleaning rates significantly. The key role of $CO_2$ after plasma breakdown is its ability to scavenge fluorine and form $COF_2$ while minimizing the recombination formation of inert $NF_3$, which by itself is not an etchant. This enhances the available etchant in the mixture ($COF_2$, fluorine and fluorine radicals) thus increasing the etch rates.

Figure 3:
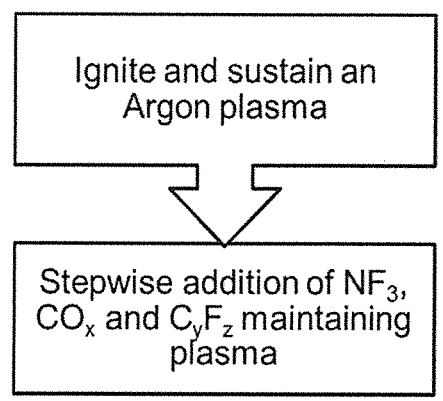
FIG. 3 is a flow chart of an argon plasma initiation and subsequent introduction of additives.
Figure 4:
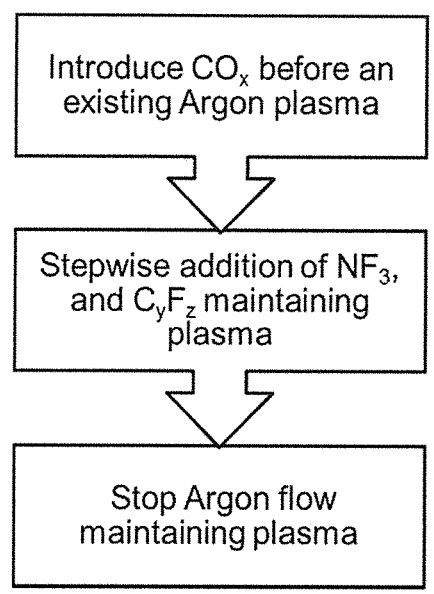
FIG. 4 is a flow chart of introduction of CO$_x$ before an existing Argon plasma and subsequent introduction of additives and cessation of Argon.

Alternatively, $COF_2$ and its variants may be generated by igniting and sustaining a plasma by stepwise addition of $CO_2$, $NF_3$ and PFCs to an argon plasma, as shown in FIG. 3. Alternatively, FIG. 4 demonstrates a plasma ignited with high flow of argon (AR) as discussed previously (target flow for clean chemistry). $CO_2$ additive gas is added pre-plasma. Subsequently, $NF_3$ and any PFCs are added. Once the plasma is stable, argon is cut-off completely, just sustaining the plasma. This particular embodiment, Formulation 2, focuses on enhancing the generation of etchant species, namely $COF_2$, in-situ for the cleaning process, in addition to fluorine/fluorine radicals formed by the plasma dissociation of $NF_3$. The key innovation of Formulation 2 is the addition of PFCs to $NF_3$ which results in the increase of in-situ generation of $COF_2$ while allowing for a larger $CO_2$ flow/dilution and reducing $NF_3$ concentrations/flows. During plasma dissociation of PFC molecules, additional fluorine/fluorine radicals are generated which leads to in-situ generation of $COF_2$ by recombination with the CO radical. Saturated, unsaturated or partially unsaturated PFC molecules of the general formula ($C_yF_z$) are chosen with a high fluorine content/molecule such as, but not limited to $C_2F_6$, $C_3F_8$, $C_4F_8$, and $C_4F_{10}$. These additive molecules have the ability to generate more fluorine per molecule than $NF_3$. The distinction from prior art is that this additive is solely for the purpose of increased in-situ generation of $COF_2$. Any other plasma breakdown fragments of the PFCs are only minor contributions to the actual etch/cleaning process.

As an example case, the chemistries involved with $C_3F_8$ addition to $NF_3$ are discussed below and this particular chemistry is referred to as Formulation 2 ($CO_2+NF_3+PFC$). The mechanisms discussed as follows are not limited to information and mechanisms shown:

The chemistry involved in the plasma dissociation of pure $NF_3$ is listed below:

$$NF_3 \rightarrow N+3/2F_2$$

Without any additive gases, post-plasma, the recombination reaction is as follows:

$$N+3/2F_2 \rightarrow NF_3$$

$CO_2$, when used as additive, breaks down in the plasma as follows:

$$CO_2 \rightarrow CO+O$$

$$CO_2 \rightarrow C+2O$$

$C_3F_8$ breakdown in plasma can be listed as follows (not stoichiometric, for illustration only):

$$nC_3F_8 \rightarrow aCF_3+bCF_2+cCF+dF$$

The in-situ generation chemistries post-plasma of $NF_3$, $CO_2$ and ($C_3F_8$ as additive are listed below:

$$CO+F \rightarrow COF$$

$$COF+F \rightarrow COF_2$$

$$CO+F_2 \rightarrow COF_2$$

$$CF_3+F \rightarrow CF_4$$

$$CF_2+F_2 \rightarrow CF_4$$

$$C+2F_2 \rightarrow CF_4$$

The primary post-plasma species generated is $COF_2$, $CF_4$ is a minor component which may or may not enhance the etch/cleaning rates significantly. No other significant fragments of $C_3F_8$ breakdown were observed. The key role of $CO_2$ after plasma breakdown is its ability to scavenge fluorine from $NF_3$ and $C_3F_8$ breakdown and form $COF_2$ while minimizing the recombination formation of inert $NF_3$ and $CF_4$, which by itself are not etch contributing molecules/fragments. This enhances the available etchant in the mixture thus significantly increases the etch/cleaning rates.

$COF_2$ and its variants may also be generated by igniting and sustaining a remote plasma by addition of $NF_3+CO_2$ to an $Ar+NF_3$ plasma, shown in FIG. 5. As discussed previously, a plasma is ignited in argon (Ar) and then a blend of Ar and $NF_3$ replaces the Ar to create a blended $Ar+NF_3$ plasma. This plasma is replaced by a direct mixture of $NF_3+CO_2$, where both species are at the desired concentrations and/or flows. The concentration of Ar and $NF_3$ are set to be able to ignite a plasma without fault and are specific to each semiconductor or LCD/FPD process tool Alternatively, shown in FIG. 6, a plasma is ignited in argon (Ar) and then a blend of Ar and $NF_3$ replaces the Ar to create an blended $Ar+NF_3$ plasma. This plasma is replaced by a direct mixture of $NF_3+CO_2+PFCs$, where all species are at the desired concentrations and/or flows. The concentration of $NF_3$, $CO_2$ and PFCs are typically in the range of about 1%-99% $NF_3$, 2%-99% $CO_2$, and 0%-99% PFC; however, the ranges may be about 2%-75% $CO_2$ and preferably 5%-50% $CO_2$ and 0%-50% PFC or preferably 0%-20% PFC, wherein the percentage of $NF_3$ makes up the remaining balance.

The plasma process described above relates to both remote and in-situ plasma generation. For remote plasma generation, a variety of plasma sources such as, but not limited to, inductively coupled plasma (ICP), microwave plasmas, torroidal plasma generators, etc., and any alterations, variations, or additions to those plasma configurations to make the etching or cleaning more efficient and/or uniform may be implemented. For in-situ generation, this can be a variety of plasma sources, such as, but not limited to ICP, conductively coupled plasma (CCP), microwave, etc., and any alterations, variations, or additions to those plasma configurations to make the etching or cleaning more efficient and/or uniform. It should be noted that the increased resistivity of the $NF_3$+Additives mixtures may affect the power of the plasma and this increase in power may also aid in increasing the etching or cleaning efficiency.

Activation Energy Sources

It should be noted that dissociation of molecules to atoms and or radicals can be effected by energy sources other than plasma. Energy sources for the activation of in-situ carbonyl fluoride ($COF_2$) generation by reaction of nitrogen trifluoride ($NF_3$), an oxide of carbon ($CO_x$, where x=1-2) and a saturated, unsaturated, or partially unsaturated perfluorocarbon compound with the general formula of $C_yF_z$ include plasma, electromagnetic radiation, pressure waves (e.g. sound that propagate through compressible gas mixture), elevated temperatures or direct contact with hot surfaces can also break apart molecules. Hot surface energy sources may include but are not limited to hot wires, heated surfaces, furnaces, and flames. Different frequency domains of electromagnetic radiation may be used to provide energy for dissociation. Frequencies such as, but not limited to radio waves, microwaves, infrared radiation, visible light, ultraviolet radiation, X-rays, alpha, beta, and gamma rays may be used independently or combined to cause the reaction or species. Plasma energy sources may include but are not limited to DC coupled, inductively coupled, capacitively coupled, microwave, glow discharge, wave-heated or electrodeless. The location of the plasma may be local or remote to the point that is $COF_2$ generated. The rate of the reaction may also be increased by the use of catalysts.

Regardless of the process described above for the generation of $COF_2$ the other significant factors in enhancing the etch rate/cleaning times is the residence time of the molecule in the chamber and the chamber pressure. With lower residence times, the etchant species does not have sufficient time to interact with the surface (residual films) and subsequently etch them. By increasing the residence time (can be accomplished by reducing the conductance, reducing number of vacuum pumps pulling the gases out etc.), there is sufficient interaction time for the in-situ generated etchant species to clean the residual films. Increasing the post-remote plasma residence time of the process gases (this increases the time of interaction between radicals to allow higher $COF_2$ generation). FIGS. 7-9, 11-13, 14, 20 and 21 demonstrate this effect. Pressure, on the other hand, is a measure of how many times the molecule impinges on the surface. By having lower pressures, the probability of the molecule impinging on the residual film surface is lower, hence a lower etch rate. Higher pressures increase the number of times the in-situ chemistry interacts with a surface, and thus increases the cleaning rate. By having a suitable pressure, wherein the in-situ generated etchant species can have sufficient interaction/impingement with the residual film surface, etch rate/cleaning times can be enhanced.

Although the primary focus of this disclosure is for the in-situ generation of $COF_2$, mixed halogenated versions and derivatives of these molecules are also possible depending on the additives used in the process.

The plasma process described in this invention relates to both remote and in-situ plasma generation in all their various forms.

It should be noted that the increased resistivity of the $NF_3$+ Additives mixtures may affect the power of the plasma and this increase in power may also aid in increasing the etching or cleaning efficiency.

Chamber Cleaning Process Improvements or Enhancements Demonstrated by the Generation of $COF_2$:

Methods of cleaning a process chamber with carbonyl fluoride ($COF_2$) are described. The present invention describes technology developed for the cleaning of deposition chambers and/or substrates at a faster rate, with a secondary advantage of lowering emissions of high global warming potential (GWP) gases such as $NF_3$. The main 'etching' (interchangeable with 'cleaning' and/or 'chamber cleaning') components in this mixture/mixtures are fluorine/fluorine radical, formed by the remote plasma breakdown of nitrogen trifluoride ($NF_3$), and the in-situ generated carbonyl fluoride.

More specifically, this process generates the cleaning/etching agent $COF_2$ which may be used in the cleaning of deposition chambers in the LCD, FPD, semiconductor and related industries for cleaning post-deposition residues inside the chamber including chamber walls, showerhead, wafer susceptor, etc. These deposition processes may include, but are not limited to the deposition of thin films of silicon, silicon dioxide, silicon nitride, silicon carbo-nitride, silicon oxynitride, silicon oxy-carbo-nitride, TEOS, BPSG, doped oxides, metal nitrides (TiN, TaN, etc.) metal oxides ($TiO_2$, etc.), etc. The invention can also be used for substrate and/or surface cleaning, modification and/or preparation. Hereinafter the surfaces to be cleaned and/or etched are collectively referred to herein as materials. Examples of materials that would benefit from such cleaning, modification, and/or preparation by the invention chemistry and process include metals, metal compounds, semiconductor substrates, PV substrates, LED/OLED, MOCVD substrates, III-V materials, etc.

The methodologies for generating $COF_2$ have been disclosed in detail above and specific examples are discussed below; however, in general the methods involve igniting and sustaining a plasma by the stepwise addition of one or more additives. A plasma is ignited in argon (Ar) and then $NF_3$ replaces the Ar to create an $NF_3$ plasma. The $NF_3$ flow is set to the desired flow and the additive is gradually introduced to the $NF_3$ plasma until the desired concentration and/or flow is reached. Additive gases such as $CO_2$, CO and/or PFCs in the remote plasma unit along with $NF_3$ undergo plasma dissociation. Subsequently, by recombination, $COF_2$ is generated in-situ of the etch chamber. $COF_2$ is highly reactive and unstable, and is a very good etch molecule to etch silicon and its compound films.

The $NF_3$ may be excited in a plasma inside the chamber or in a remote plasma region upstream from the chamber. The in-situ generation of $COF_2$ can be accomplished using a post remote plasma recombination of reactive species or recombination of the species in an in-situ plasma environment. The additive(s) may be introduced upstream or downstream of the remote plasma such that both $NF_3$ and the additive(s) (and any plasma-generated effluents) are present in the chamber during cleaning. The generation of $COF_2$ enhances the chamber-cleaning effectiveness and simultaneously allows less $NF_3$ to be used and discarded. Exemplary chambers may include chemical vapor deposition (CVD)) chambers, physical vapor deposition (PVD) chambers, and atomic-layer deposition (ALD) chambers, among other kinds of process chambers.

The additive(s) may be introduced downstream from the remote plasma region such that, in essence, only the $NF_3$ passes through plasma excitation in embodiments of the invention. Plasmas may also be present in both regions. In some embodiments, a hot surface such as a filament is used in place of a plasma in any of the plasma configurations described. The $COF_2$ formed by the plasma dissociation may be referred to as the cleaning mixture. The cleaning mixture may also include a non-reactive gas such as nitrogen ($N_2$), helium (He), neon (Ne) and/or argon (Ar), as well as mixtures thereof. Non-reactive gases may help to statistically reduce the chance for $NF_3$ fragments to recombine and form an $NF_3$ molecule. Some non-reactive gases may also assist in igniting and maintaining the plasma.

Silicon-containing contaminants are typical contaminants which $COF_2$ treatments are intended to remove. The silicon-containing contaminants may include deposits of silicon oxide on interior surfaces of a deposition chamber during a preceding silicon oxide substrate deposition process. Contaminants may also include silicon nitrides, poly-silicons, silicides, silicon oxy-nitrides, and doped silicon glasses, among other contaminants. As noted above, an exemplary processing chamber for use with the cleaning procedures described include a chemical vapor deposition (CVD) chamber. The claimed cleaning methods may find utility for other chambers such as PVD and ALD chambers. A substrate may or may not be present in the deposition chamber during the cleaning procedure. $NF_3$ introduction into the exhaust system may be reduced both by decreasing the amount of $NF_3$ needed to remove a given contaminant and by reducing the recombination of $NF_3$ fragments to form $NF_3$. Traditional abatement methods may be performed on any remaining $NF_3$ emissions including combusting the emissions and/or treating them with a water scrubber. Combining the methods described herein with the traditional abatement methods may achieve a further reduction in $NF_3$ released into the atmosphere.

The invention is further illustrated by the following non-limited examples. All scientific and technical terms have the meanings as understood by one with ordinary skill in the art. The methods may be adapted to variation in order to produce compositions embraced by this invention but not specifically disclosed. Further, variations of the methods to produce the same compositions in somewhat different fashion will be evident to one skilled in the art.

EXPERIMENTAL

Formulation 1 Experiments

Terminology

"Pre-Plasma" indicates that $NF_3$ and $CO_2$ were placed through the plasma together, thus dissociating each species to cause interactions.

"Post-Plasma" indicates that $NF_3$ was placed through the plasma to dissociate and $CO_2$ was added downstream of the plasma effluent.

"$CO_2$ Replacement" indicates that $NF_3$ was replaced by $CO_2$ in the process keeping the total flow constant.

"$CO_2$ Addition" indicates that $CO_2$ was added on top of a constant flow of $NF_3$ in the process.

Experiments were conducted to see the effects of adding $CO_2$ to $NF_3$ in a remote plasma on the chamber cleaning time/etch rate and chamber emissions. $CO_2$ was added to $NF_3$ both pre-plasma (i.e. $NF_3$ and $CO_2$ create a plasma together) and post-plasma (i.e. $CO_2$ interacts with the $NF_3$ plasma products). A clean time/etch rate was determined for various $NF_3$+$CO_2$ recipes based on the removal of a 300 nm silicon nitride deposition. An example of this can be seen in FIG. 7.
1. Time-of-flight mass spectrometry (TOFMS) and FTIR data were taken just downstream of the chamber.
2. The FTIR data has been reprocessed with calibrations taken at low pressure.
3. Silicon nitride substrates or deposited films were used at obtain etch rate results The remote plasma was self-adjusting of the power needed to sustain a plasma Two sets of experiments were conducted:
1. Low conductance regime
    a. Four sets of experiments each for $CO_2$ replacement and addition
2. High conductance regime
    a. One set of experiments for $CO_2$ replacement and addition First Run of Experiments: (Low Conductance)
Two experiments were performed at higher $NF_3$ flows and higher pressure (Runs 1 and 2) and two experiments were performed at lower $NF_3$ flows and same pressures as runs 1 and 2 (Runs 3 and 4).

Data Demonstrated Excellent Reproducibility of all Experiments

Second run of experiments: (high conductance)
One set of experiments for replacement as well as addition of $CO_2$ were conducted keeping same flow rates and process pressures as runs 1 and 2 (low conductance).

$COF_2$ Etching
    $COF_2$ is in-situ generated from $NF_3$ and $CO_2$ (Formulation 2—add PFC also).
    Reaction time is important for $COF_2$ generation.
    Higher residence time in chamber for reactant species=Higher $COF_2$ amount generated=Higher etch rates.
    Higher residence time=Lower conductance.

Example 1

Pre-Plasma $CO_2$ Replacement of $NF_3$

Figure 6:
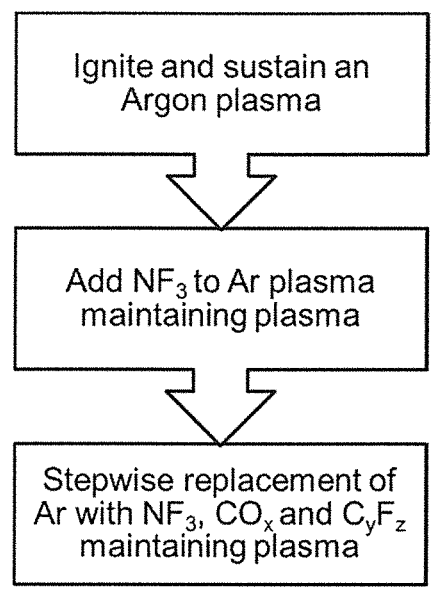
FIG. 6 is a flow chart of an Argon plasma initiation, addition of an Argon/NF$_3$ mixture subsequently replacing with a mixture of NF$_3$ and additives.
Figure 7:
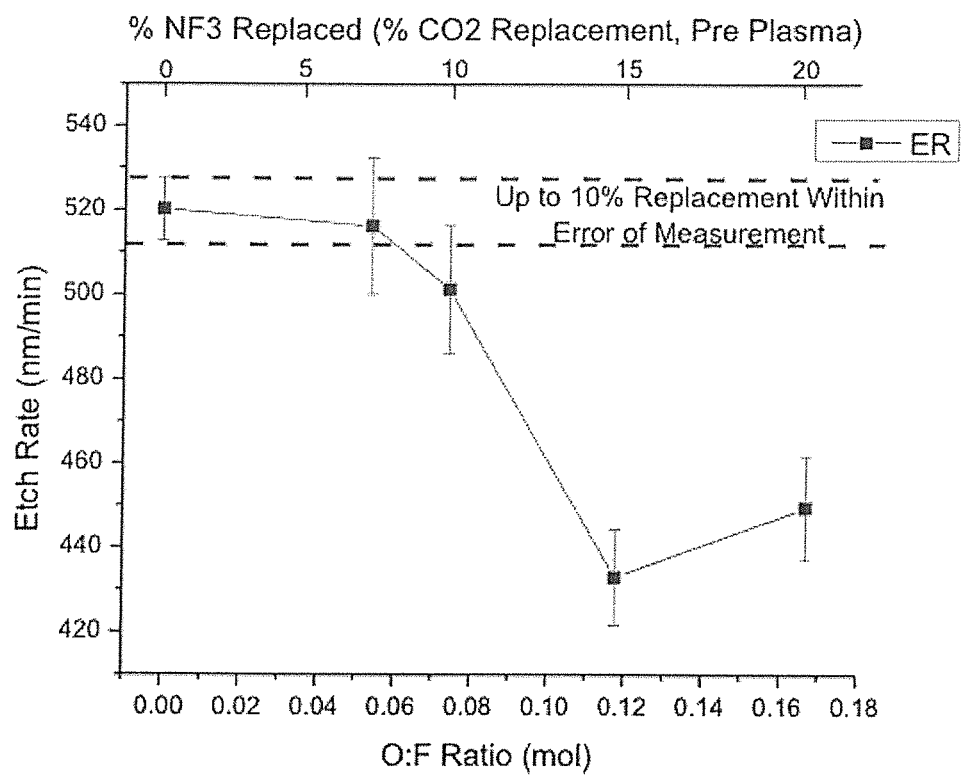
FIG. 7 shows a plot of Etch Rate/Clean Time Results for Pre-Plasma CO$_2$ Replacement of NF$_3$ demonstrating no change in etch rate with up to 10% replacement of NF$_3$ with CO$_2$.
Figure 8:
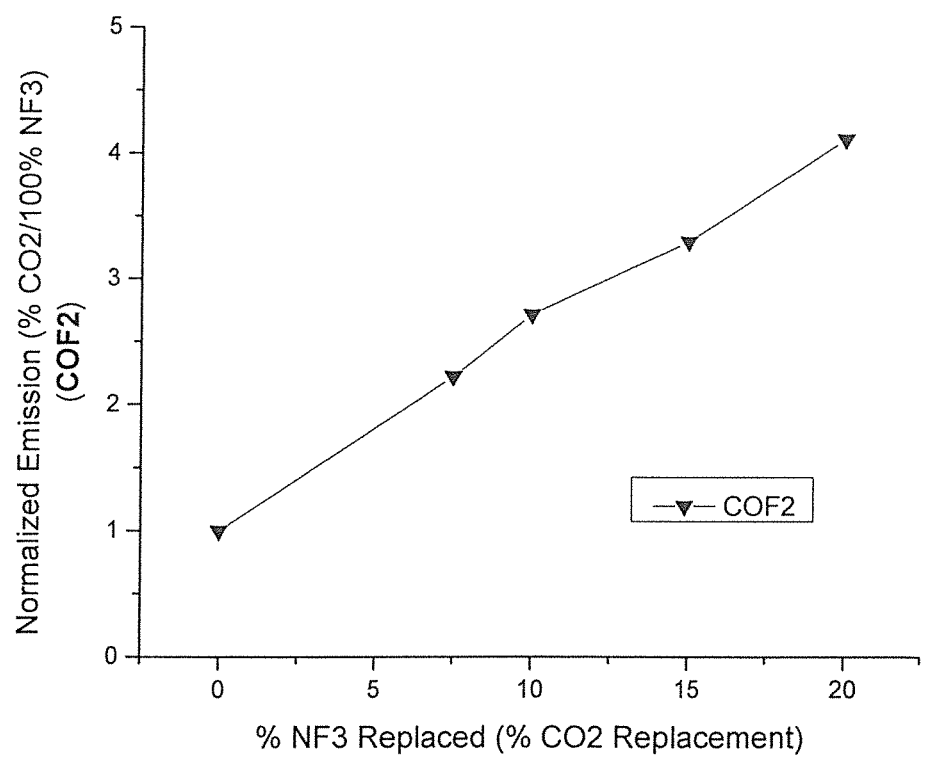
FIG. 8 shows a plot demonstrating the formation of in-situ COF$_2$ observed as NF$_3$ is replaced by CO$_2$ with a total flow constant around 20 SLPM.

Experiments were performed having various parameters all of which can be seen in FIG. 6. Table 1 details the experimental setup parameters for pre-plasma replacement of $NF_3$—run 1.

All etch times @ 1 minute unless noted otherwise
Plasma operated at minimum power to sustain plasma

TABLE 1

| Total flow (sccm) | | | | | | 1000 | | |
|---|---|---|---|---|---|---|---|---|
| | | | Initial | | RF | Etch rate (nm/min) | | |
| $NF_3$ (sccm) | $CO_2$ | Fraction $CO_2$ | Thickness (μm) | Pressure (mTorr) | Power (W) | Reflectometer | Profilometer | Average |
| 1000 | 0.0 | 0 | 1947.44 | 860 | 5000 | 1250 | 1000 | 1125 |
| 960 | 40.0 | 0.04 | 1940.48 | 876 | 5000 | 1460 | 1224 | 1342 |
| 920 | 80.0 | 0.08 | 1905.44 | 895 | 5800 | 1800 | 1588 | 1694 |
| 870 | 130.0 | 0.13 | 1913.15 | 880 | 6000 | 1830 | 1621 | 1725.5 |
| 820 | 180.0 | 0.18 | 1967.19 | 860 | 6400 | 1720 | 1559 | 1639.5 |
| 750 | 250.0 | 0.25 | 1947.86 | 835 | 6600 | 1670 | 1477 | 1573.5 |

The results of the Run 1 experiment are as follows:
Maximum etch rate: 1725 nm/min
$CO_2$ fraction @ max etch rate: 13%
$NF_3$ fraction @ max etch rate: 87%
Edge effect—Difference in reflectometer and profilometer etch rates.
Etch rate closer to mask edge is slower than bulk etch rate (not RIE).
Pre-Plasma Replacement of $NF_3$—Run 2, the results of which are as follows:
Maximum etch rate: 1736 nm/min
$CO_2$ fraction @ max etch rate: 18%
$NF_3$ fraction @ max etch rate: 82%
Pre-Plasma Replacement of $NF_3$—Run 3 was performed To check effects of total gas flow, the gas flow rates were reduced by half:
$CO_2$ replacement:
  500 sccm total flow
$CO_2$ addition:
  500 sccm constant flow of $NF_3$
  Additional $CO_2$ added to constant $NF_3$
Pre-Plasma Replacement of $NF_3$—Run 3, the results of which are as follows:
Maximum etch rate: 1634 nm/min
$CO_2$ fraction @ max etch rate: 13%
$NF_3$ fraction @ max etch rate: 87%
Pre-Plasma Replacement of $NF_3$—Run 4 was performed to check effects of pressure, the gas flow rates were kept constant as run 3, but throttle valve wide open to get process pressures ~600 mTorr:
$CO_2$ replacement:
  500 sccm total flow
$CO_2$ addition:
  500 sccm constant flow of $NF_3$
  Additional $CO_2$ added to constant $NF_3$
Pre-Plasma Replacement of $NF_3$—Run 4, the results of which are as follows:
Maximum etch rate: 1142 nm/min
$CO_2$ fraction @ max etch rate: 8%
$NF_3$ fraction @ max etch rate: 92%

Pre-Plasma Replacement of $NF_3$—Run 5 was performed with the following parameter changes:
Alter residence times of reactants in the cleaning chamber
To check effects of residence time, the flow conductance to the vacuum pump was increased
Lines changed from KF-40 (~1.5" ID) to ISO-100 (~4" ID), thereby increasing conductance significantly
All other process parameters kept constant as Run 1, including pressure and flow rates.

Figure 9:
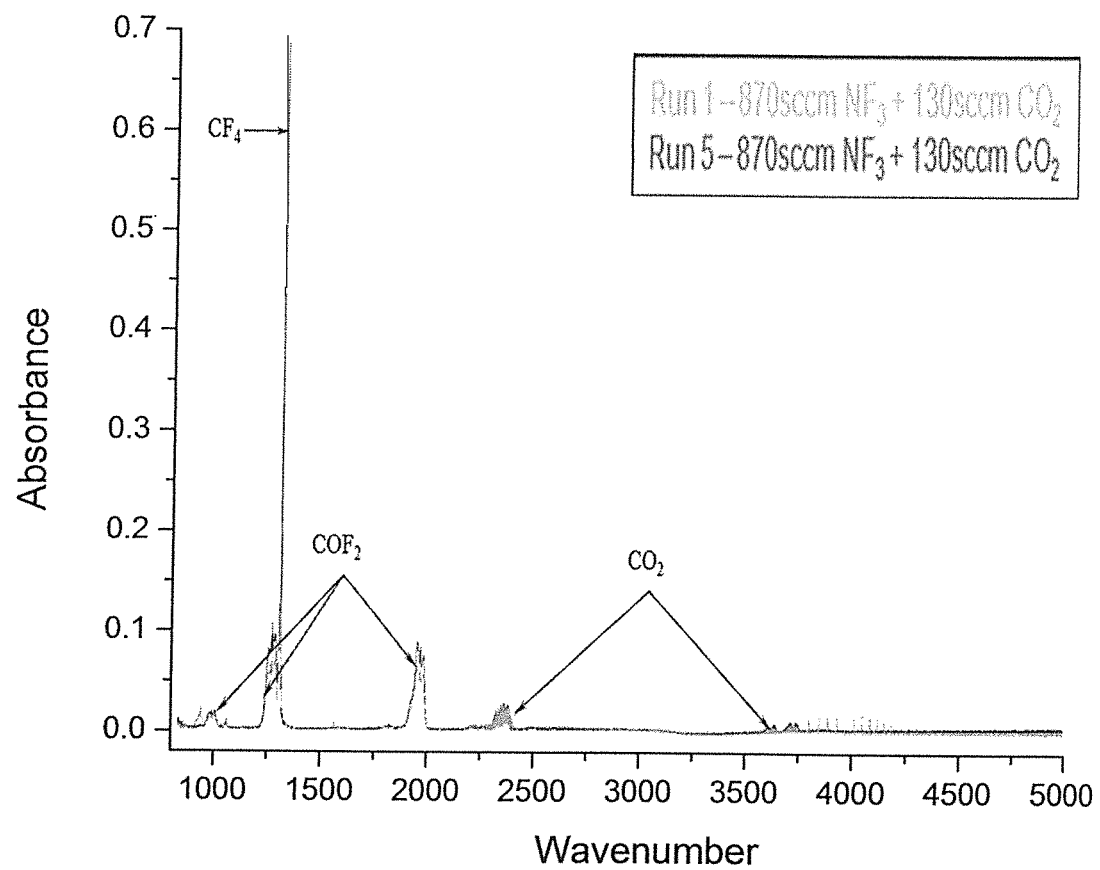
FIG. 9 provides FTIR data comparison of FIGS. 10 and 11.
Figure 10:
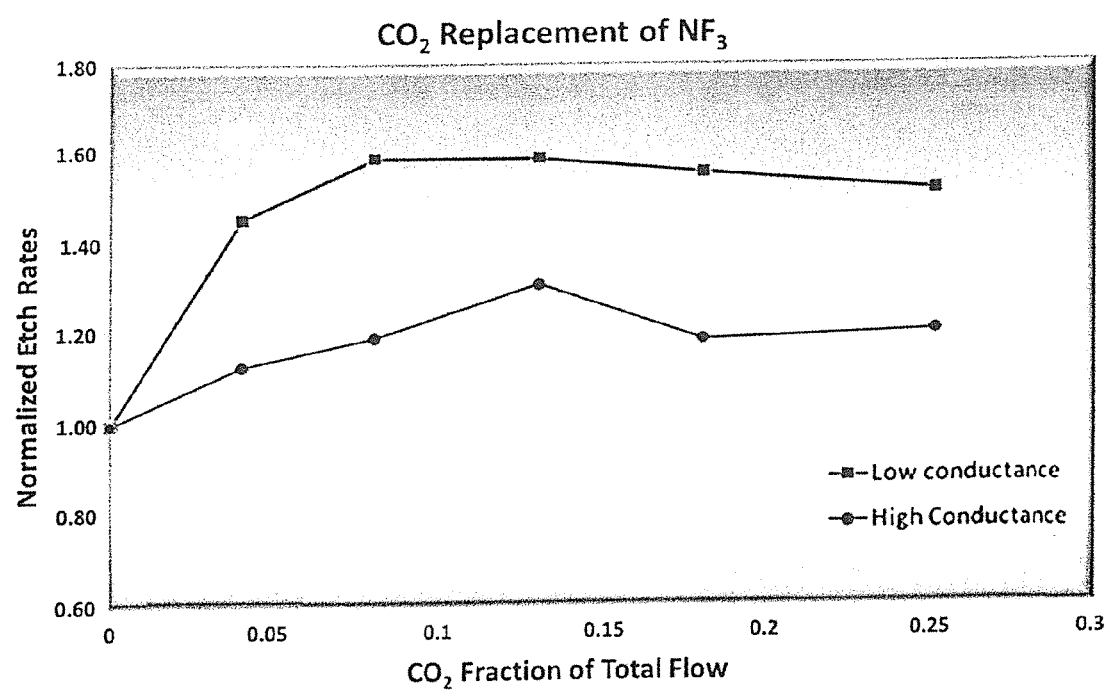
FIG. 10 shows a plot demonstrating normalized etch rates of in-situ COF$_2$ observed as NF$_3$ is replaced by CO$_2$, pre-plasma replacement at both low and high conductance.
Figure 11:
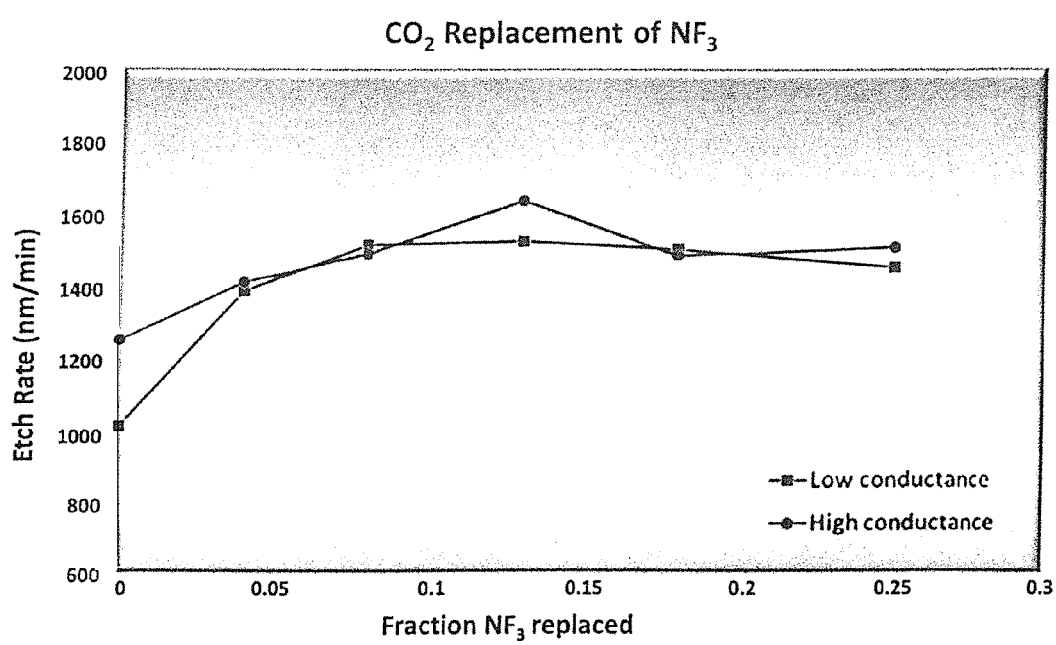
FIG. 11 shows a plot demonstrating etch rates of in-situ COF$_2$ observed as NF$_3$ is replaced by CO$_2$, pre-plasma replacement at both low and high conductance.

Data Summary—Normalized Etch Rates to pure $NF_3$ etching, Low Conductance: Average of Runs 1, 2, 3, 4 and High Conductance—Run 5 are shown in FIG. 10.
Data Summary—Absolute Etch Rates, Low Conductance: Average of Runs 1, 2, 3, 4 and High Conductance—Run 5 are shown in FIG. 11.
FTIR Data Comparison, Pre-plasma Replacement—Run 1 and 5 is shown in FIG. 9.
Absorbance from $COF_2$—almost identical in both run 1 and 5
Residual $CO_2$ absorbance—almost identical
Etch rate of Run 1 higher than Run 5.
Primary cause—Longer residence times inside chamber in Run 1
Longer residence times inside chamber→Higher $COF_2$ in chamber
Higher $COF_2$ in chamber→Higher etch rate
Similar $COF_2$ seen in FTIR due to longer time to sampling
Pre-Plasma Replacement
The following results are for pre-plasma replacement of $NF_3$ with $CO_2$ the results of which are summarized in Table 2.

TABLE 2

| Run # | Residence time | Conditions |
|---|---|---|
| 1 | High | Total flow 1 SLPM; Pressure constant |
| 2 | High | Total flow 1 SLPM; Pressure constant |
| 3 | High | Total flow 500 sccm; Pressure constant |
| 4 | High | Total flow 500 sccm; low pressure |
| 5 | Low | Total flow 1 SLPM; Pressure constant |

Example 2

Pre-Plasma $CO_2$ Addition to $NF_3$

Figure 12:
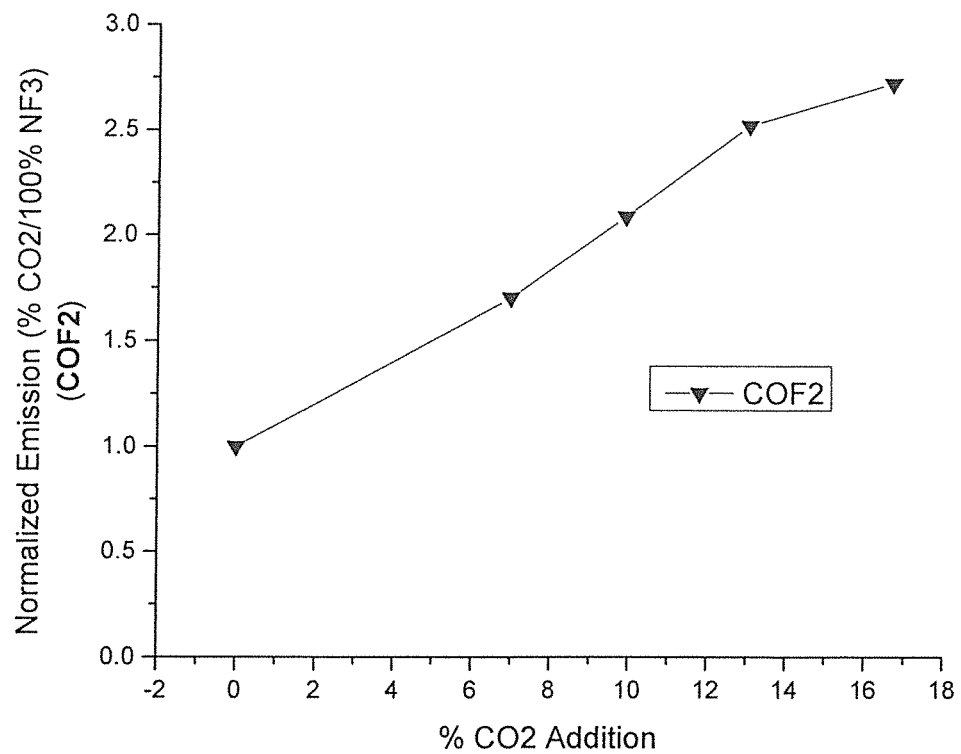
FIG. 12 shows a plot demonstrating the formation of in-situ COF$_2$ observed as CO$_2$ is added to NF$_3$ pre-plasma.

Experiments were performed having various parameters all of which can be seen in FIG. 12. Table 3 details the experimental setup parameters for Pre-Plasma Addition of $CO_2$—run 1.

Etch rate at 0.25 fraction $CO_2$ projected value.
Actual etch time=45 sec $$\text{Actual etch rates} = 1404 \text{(Profilometer)}$$
$$= 1590 \text{(Reflectometer)}$$

TABLE 3

| $NF_3$ (sccm) | $CO_2$ (sccm) | Fraction $CO_2$ | Initial Thickness (μm) | Pressure (mTorr) | RF Power (W) | Etch rate (nm/min) Reflectometer | Profilometer | Average |
|---|---|---|---|---|---|---|---|---|
| 1000 | 0.0 | 0 | 1929.18 | 878 | 5000 | 1130 | 903 | 1016.5 |
| 1000 | 41.7 | 0.04 | 1971.3 | 926 | 5400 | 1720 | 1537 | 1628.5 |
| 1000 | 87.0 | 0.08 | 1964.87 | 938 | 5800 | 1840 | 1650 | 1745 |
| 1000 | 149.4 | 0.13 | 1954.65 | 954 | 6200 | 1930 | 1747 | 1838.5 |
| 1000 | 219.5 | 0.18 | 1957.6 | 976 | 6600 | 1980 | 1834 | 1907 |
| 1000 | 333.3 | 0.25 | 1951.8 | 995 | 7000 | 2120 | 1872 | 1996 |

Pre-Plasma Addition of $CO_2$—Run 1, the results of which are as follows:
  Maximum etch rate: 1926 nm/min
  $CO_2$ fraction @ max etch rate: 25%
  $NF_3$ fraction @ max etch rate: 75%
Pre-Plasma Addition of $CO_2$—Run 2, the results of which are as follows:
  Maximum etch rate: 1926 nm/min
  $CO_2$ fraction @ max etch rate: 25%
  $NF_3$ fraction @ max etch rate: 75%
Pre-Plasma Addition of $CO_2$—Run 3, the results of which are as follows:
  Maximum etch rate: 1936 nm/min
  $CO_2$ fraction @ max etch rate: 25%
  $NF_3$ fraction @ max etch rate: 75%
Pre-Plasma Addition of $CO_2$—Run 4, the results of which are as follows:
  Maximum etch rate: 1936 nm/min
  $CO_2$ fraction @ max etch rate: 25%
  $NF_3$ fraction @ max etch rate: 75%
Pre-Plasma Addition of $CO_2$—Run 5 was performed with the following parameter changes:
  Alter residence times of reactants in the cleaning chamber.
  To check effects of residence time, the flow conductance to the vacuum pump was increased.
  Lines changed from KF-40 (~1.5" ID) to ISO-100 (~4" ID), thereby increasing conductance significantly.
All other process parameters kept constant as Run 1, including pressure and flow rates.

Formulation 1 Pre-Plasma Addition

Figure 14:
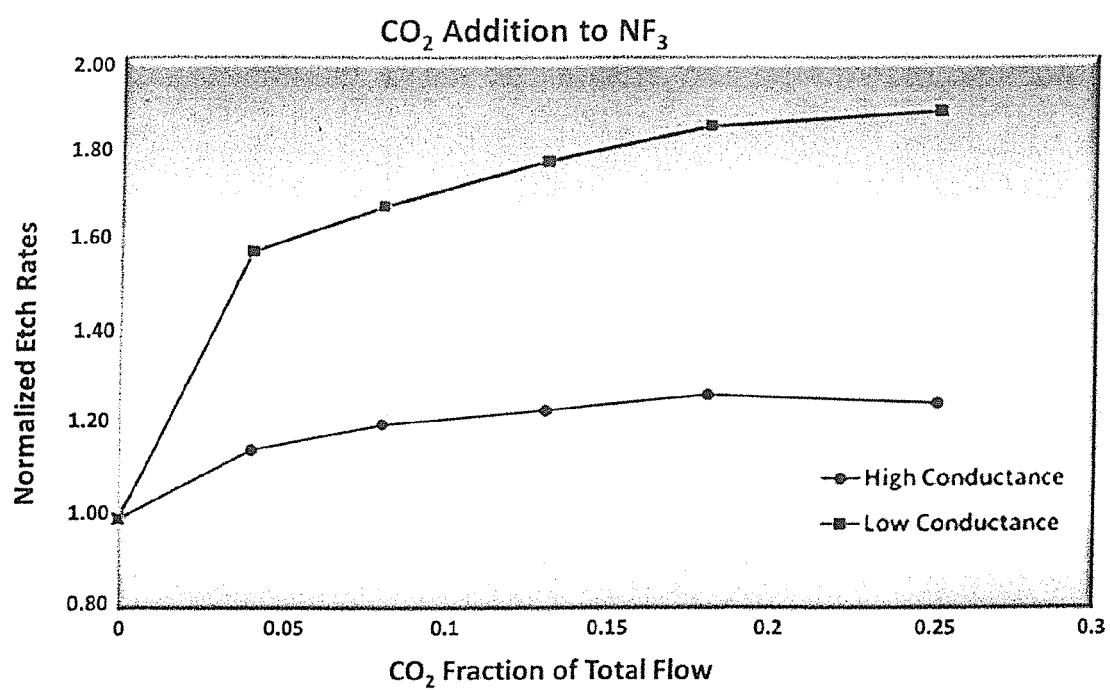
FIG. 14 shows a plot demonstrating normalized etch rates of in-situ COF$_2$ observed as CO$_2$ is added to NF$_3$, pre-plasma at both low and high conductance.
Figure 15:
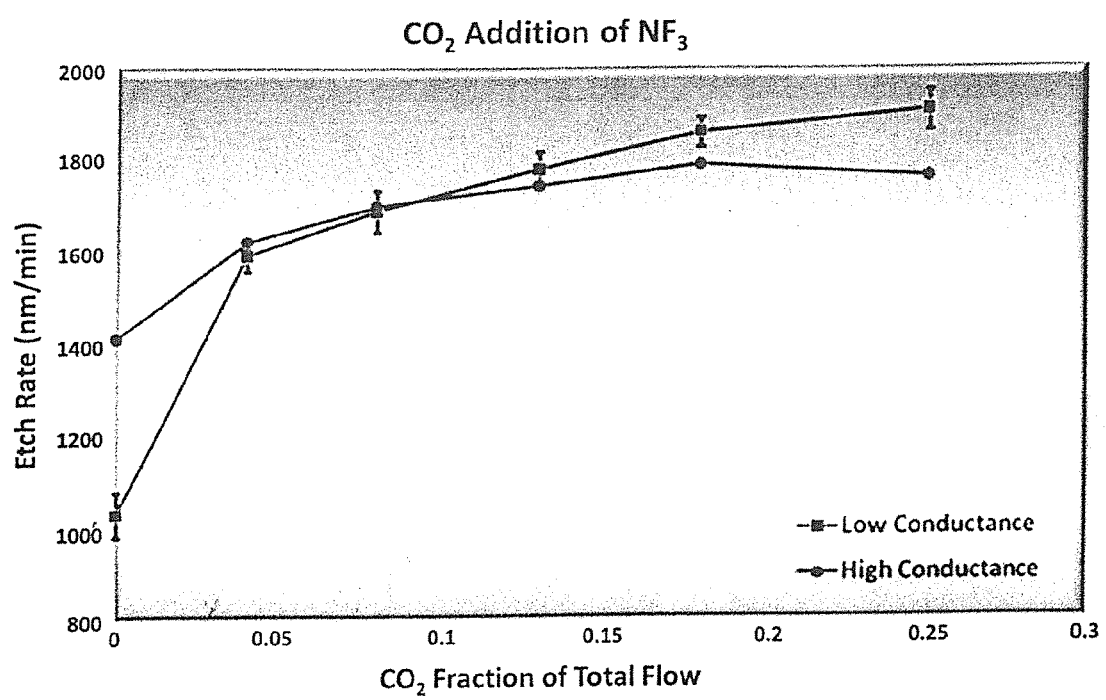
FIG. 15 shows a plot demonstrating etch rates of in-situ COF$_2$ observed as CO$_2$ is added to NF$_3$, pre-plasma at both low and high conductance.

Data Summary—Normalized Etch Rates to pure $NF_3$ etching, Low Conductance: Average of Runs 1, 2, 3, 4 and High Conductance—Run 5 are shown in FIG. 14.
Data Summary—Absolute Etch Rates, Low Conductance: Average of Runs 1, 2, 3, 4 and High Conductance—Run 5 are shown in FIG. 15.

FTIR Data Comparison

Figure 13:
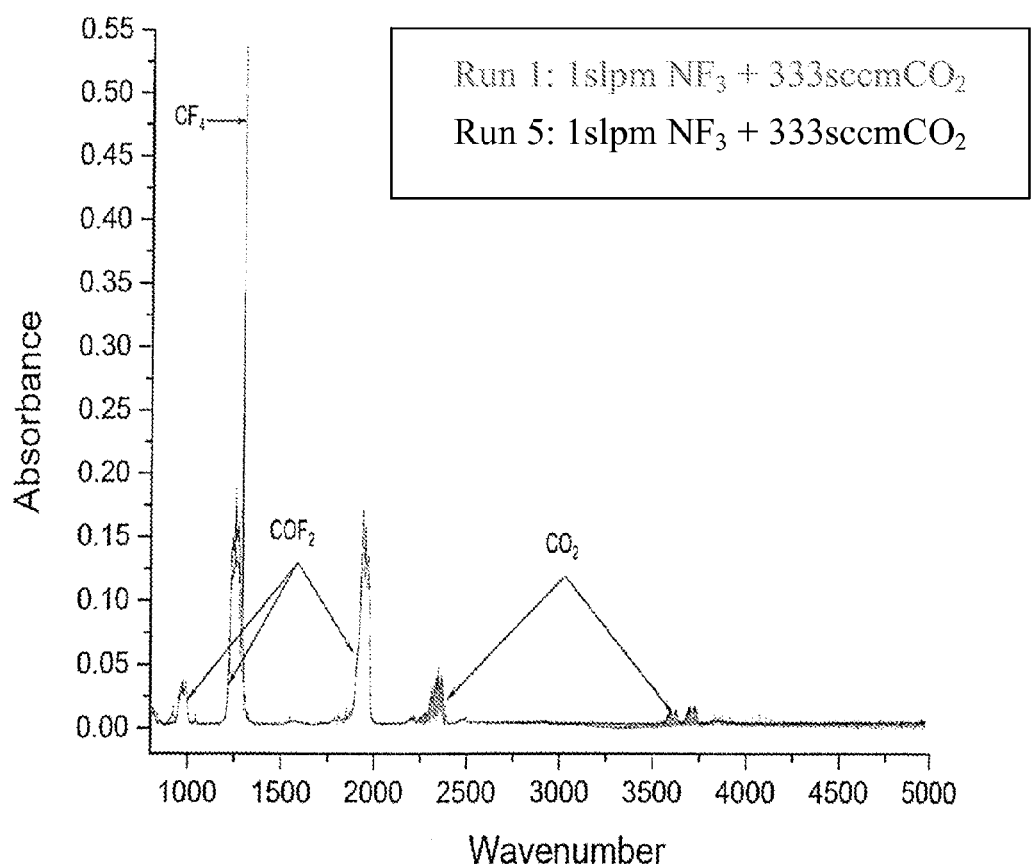
FIG. 13 provides FTIR data comparison of FIGS. 14 and 15.

Pre-plasma Addition—Run 1 and 5 is shown in FIG. 13
  Absorbance from $COF_2$—almost identical in both run 1 and 5.
  Residual $CO_2$ absorbance—almost identical.
  Etch rate of Run 1 higher than Run 5.
    Primary cause—Longer residence times inside chamber in Run 1.
    Longer residence times inside chamber→Higher $COF_2$ in chamber.
    Higher $COF_2$ in chamber→Higher etch rate.
    Similar $COF_2$ seen in FTIR due to longer time to sampling.

FIG. 14 shows data collected of the effect of $COF_2$ on etch rates.
Results in Table 4 are for pre-plasma addition of $CO_2$ to $NF_3$.

TABLE 4

| Run # | Residence time | Conditions |
|---|---|---|
| 1 | High | $NF_3$ 1SLPM; Pressure constant |
| 2 | High | $NF_3$ 1SLPM; Pressure constant |
| 3 | High | $NF_3$ 500 sccm; Pressure constant |
| 4 | High | $NF_3$ 500 sccm; low pressure |
| 5 | Low | $NF_3$ 1SLPM; Pressure constant |

Example 3

Post-Plasma $CO_2$

Replacement of $NF_3$

Figure 16:
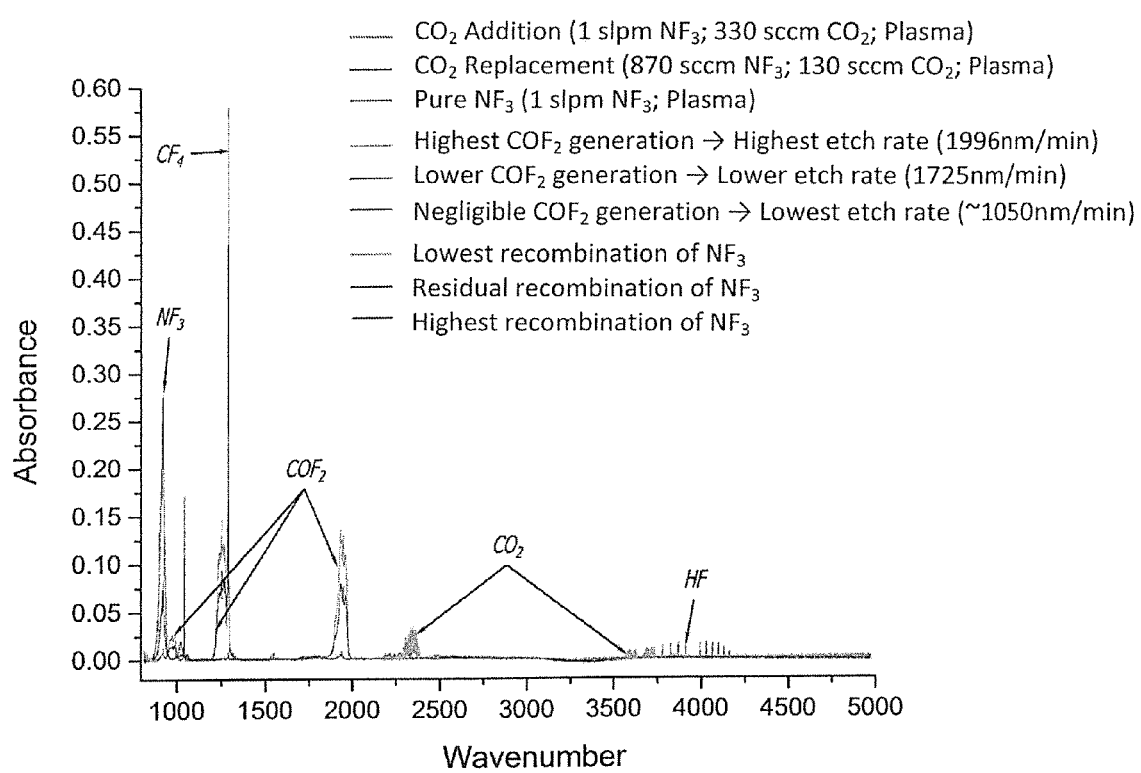
FIG. 16 provides FTIR data of the effect of COF$_2$ on etch rates.
Figure 17:
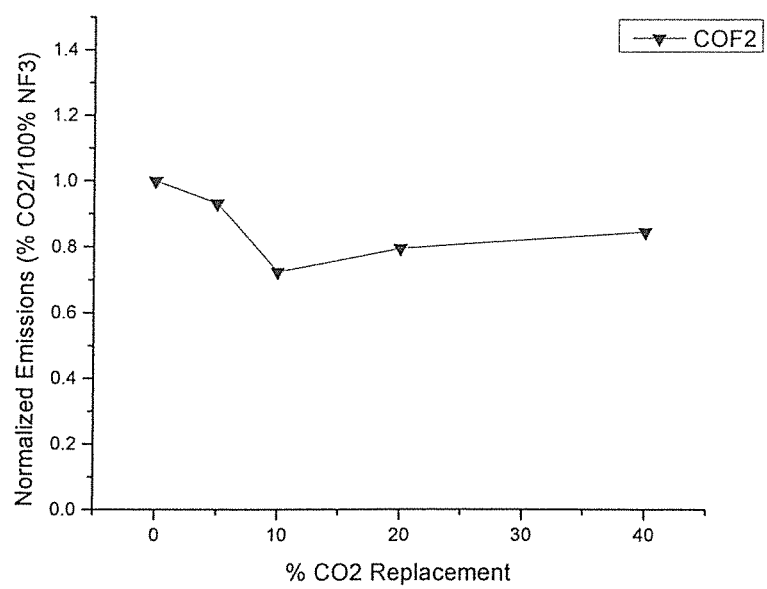
FIG. 17 shows a plot demonstrating the formation of COF$_2$ observed as an alternate chamber cleaning molecule, post-plasma CO$_2$ replacement of NF$_3$.
Figure 18:
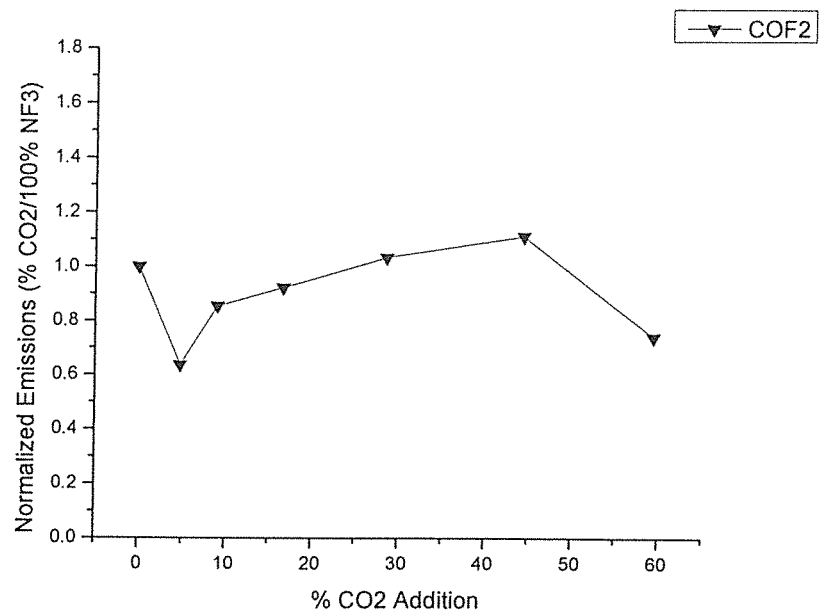
FIG. 18 shows a plot demonstrating the formation of COF$_2$ observed as an alternate chamber cleaning molecule, post-plasma CO$_2$ addition of NF$_3$.

Post-Plasma $CO_2$ Replacement of NF3, FTIR Chamber Effluent Data shown in FIG. 15.
Post-Plasma $CO_2$ Addition to $NF_3$, FTIR Chamber Effluent Data shown in FIG. 16.

Summary

TABLE 5

| Pre-Plasma Formulation 1 | Post-Plasma Formulation 1 |
|---|---|
| $CO_2$ Replacement | $CO_2$ Replacement |
| Replaced $NF_3$ with $CO_2$ from 0 to 20%<br>Total flow constant at 20 SLPM | Replaced $NF_3$ with $CO_2$ from 0 to 40%<br>Total flow constant at 30 SLPM |
| $CO_2$ Addition | $CO_2$ Addition |
| Added $CO_2$ on top of constant $NF_3$ flow from 0 to ~17%<br>$NF_3$ flow constant at 20 SLPM | Added $CO_2$ on top of constant $NF_3$ flow from 0 to ~60%<br>$NF_3$ flow constant at 30 SLPM |

Explanation of Calculation of Clean Times

Of all the Formulation 1 scenarios tested, the pre-plasma $NF_3+CO_2$ mixtures worked best.

Of the two pre-plasma experiments, the $CO_2$ replacement of $NF_3$ provides the maximum benefit.

Up to 10% replacement of $NF_3$ is possible while maintaining the etch rate/clean time.

A ~40% reduction in $NF_3$ emissions is realized.

The impact of GWP by-products is shown to have negligible impact on the total MMTCE contributions.

The disclosed FTIR and TOFMS data validate and support the above mentioned statements.

Formulation 1—Conclusions

Pure $NF_3$ etching—Fluorine dominant etchant.

Formulation 1—Fluorine and $COF_2$ dominant etchant species.

Low residence time—Optimized for $NF_3$ etching.
  High residence time—Optimized for $COF_2$ etching.
  $CO_2$ addition has higher etch rate than $CO_2$ replacement (due to higher $COF_2$ generated).
  No significant variation with flow rate (excess gas compared to cleaning surface/sample).
  Minimal effect from process pressure (in the ranges explored: <20% variation).
  FTIR data suggests almost identical amounts of $COF_2$ generation from the absorption spectra (downstream of etching chamber) for lower and higher chamber residence times.
  Formation of $COF_2$ downstream of etching chamber does NOT help in chamber cleaning, hence the lower etching rates.

Formulation 2 Experiments

Example 4

Formulation 2: How is it different than Formulation 1?
  Formulation 1→$NF_3+CO_2$
    ~10% reduction in $NF_3$ consumption with current hardware configuration
    Maintains cleaning rates
  New requirements:
    Increase cleaning rates up to 3×
    Reduce $NF_3$ consumption >15-20%, 25%+preferred
    Experimental limitations:
    Current hardware configuration
    Formulation 2→$NF_3+CO_2+C_3F_8$
    Ternary mixture
    ~40-50% reduction in $NF_3$ consumption
    ~40-50% increase in cleaning rates
  Etching species:
    F and $F_2$
    $COF_2$ (In-situ generation; dominant etchant species)
    $CF_4$ (minimal effect)
    $C_3F_8$ with $CO_2$ and $NF_3$ breaks down into $COF_2$ and $CF_4$ in the plasma;
    Confirmed with in-situ FTIR analyses
  Design of experiments:
    Central composite design
    Face centered design
    3 factors ($NF_3$, $CO_2$, $C_3F_8$)
    Two replicates to study reproducibility/variance
    Response factor—Etch rate of PECVD Silicon Nitride samples Experimental procedure:
    Samples masked using Kapton tape
    Etch time=30 s
  Etch rate determination:
    Reflectometer measurements before etching
    Reflectometer after etching
  Analysis of results/response factor:
    Maximum of $|R|^2$
    f-statistic significance
    Plot response surface—$NF_3$ vs $C_3F_8$; vary $CO_2$
  Formulation 2 Design Of Experiments: Central Composite—FCC design
  3 Factors
  3 Centerpoints
  Quadratic Model with 10 items
  Response=b0+b1*$NF_3$, sccm+b2*$CO_2$, sccm+b3 $C_3F_8$, sccm+b4*$NF_3$, sccm*$NF_3$, sccm+b5*$CO_2$, sccm*$CO_2$, sccm*b6*$C_3F_8$, sccm*$C_3F_8$, sccm+b7*$NF_3$, sccm*$CO_2$, sccm+b8*$NF_3$, sccm*$CF_3F_8$, sccm*$C_3F_8$, sccm+b9*$CO_2$, sccm*$C_3F_8$, sccm.

TABLE 6

| Exp # | $NF_3$, sccm | $CO_2$, sccm | $C_3F_8$, sccm | Resp 1 | Initial | Final | RF Power | % $NF_3$ | % $CO_2$ | % $C_3F_8$ |
|---|---|---|---|---|---|---|---|---|---|---|
| 125 | 500 | 700 | 0 | 1416.96 | 1903.31 | 1194.83 | 8000 | 41.7 | 58.3 | 0.0 |
| 126 | 500 | 0 | 300 | 1004.16 | 1935.26 | 1433.18 | 7200 | 62.5 | 0.0 | 37.5 |
| 127 | 750 | 350 | 150 | 1987.6 | 1945.45 | 951.65 | 8200 | 60.0 | 28.0 | 12.0 |
| 128 | 1000 | 700 | 0 | 2707.58 | 1948.67 | 594.88 | 8200 | 58.8 | 41.2 | 0.0 |
| 129 | 750 | 700 | 150 | 2901.74 | 1924.9 | 474.03 | 9200 | 46.9 | 43.8 | 9.4 |
| 130 | 1000 | 0 | 300 | 1397.36 | 1950.23 | 1251.55 | 7400 | 76.9 | 0.0 | 23.1 |
| 131 | 750 | 700 | 150 | 1490.62 | 1943.16 | 1197.85 | 6800 | 83.3 | 0.0 | 16.7 |
| 132 | 500 | 0 | 300 | 1911 | 1912.99 | 957.49 | 9800 | 33.3 | 46.7 | 20.0 |
| 133 | 500 | 0 | 0 | 1606.78 | 1929.66 | 1126.27 | 4800 | 100.0 | 0.0 | 0.0 |
| 134 | 500 | 350 | 150 | 1757.22 | 1934.38 | 1055.77 | 8400 | 50.0 | 35.0 | 15.0 |
| 135 | 1000 | 350 | 150 | 2243.76 | 1933.93 | 812.05 | 8200 | 66.7 | 23.3 | 10.0 |
| 136 | 750 | 350 | 300 | 1310.94 | 1946.66 | 1291.19 | 8800 | 53.6 | 25.0 | 21.4 |
| 137 | 750 | 350 | 150 | 2152.02 | 1926.72 | 850.71 | 8400 | 60.0 | 28.0 | 12.0 |
| 138 | 750 | 350 | 150 | 2236.44 | 1903.69 | 785.47 | 8400 | 60.0 | 28.0 | 12.0 |
| 139 | 1000 | 0 | 0 | 1876.82 | 1921.44 | 983.03 | 5000 | 100.0 | 0.0 | 0.0 |
| 140 | 1000 | 700 | 300 | 2101.74 | 1923.11 | 872.24 | 9800 | 50.0 | 35.0 | 15.0 |
| 141 | 750 | 350 | 0 | 2596 | 1936.58 | 638.58 | 7200 | 68.2 | 31.8 | 0.0 |

Fit
Resp__11=b0+b1*NF$_3$, sccm+b2*NF$_3$, sccm*NF$_3$, sccm+b3*C$_3$F$_8$, sccm*C$_3$F$_8$, sccm+b4*O$_2$, sccm*C$_3$F$_8$, sccm+b5*NF$_3$, sccm*CO$_2$, sccm

| Summary | |
|---|---|
| \|R\| | 0.874 |
| R$^2$ | 0.765 |
| R$^2$ adjusted | 0.658 |
| Standard Error | 306.26 |
| # Points | 17 |
| PRESS | 2709605.98 |
| R$^2$ for Prediction | 0.382 |
| Durbin-Watson d | 2.063 |
| First Order Autocorrelation | −0.225 |
| Collinearity | 0.003 |
| Coefficient of Variation | 15.923 |
| Precision Index | 23.627 |

Figure 19:
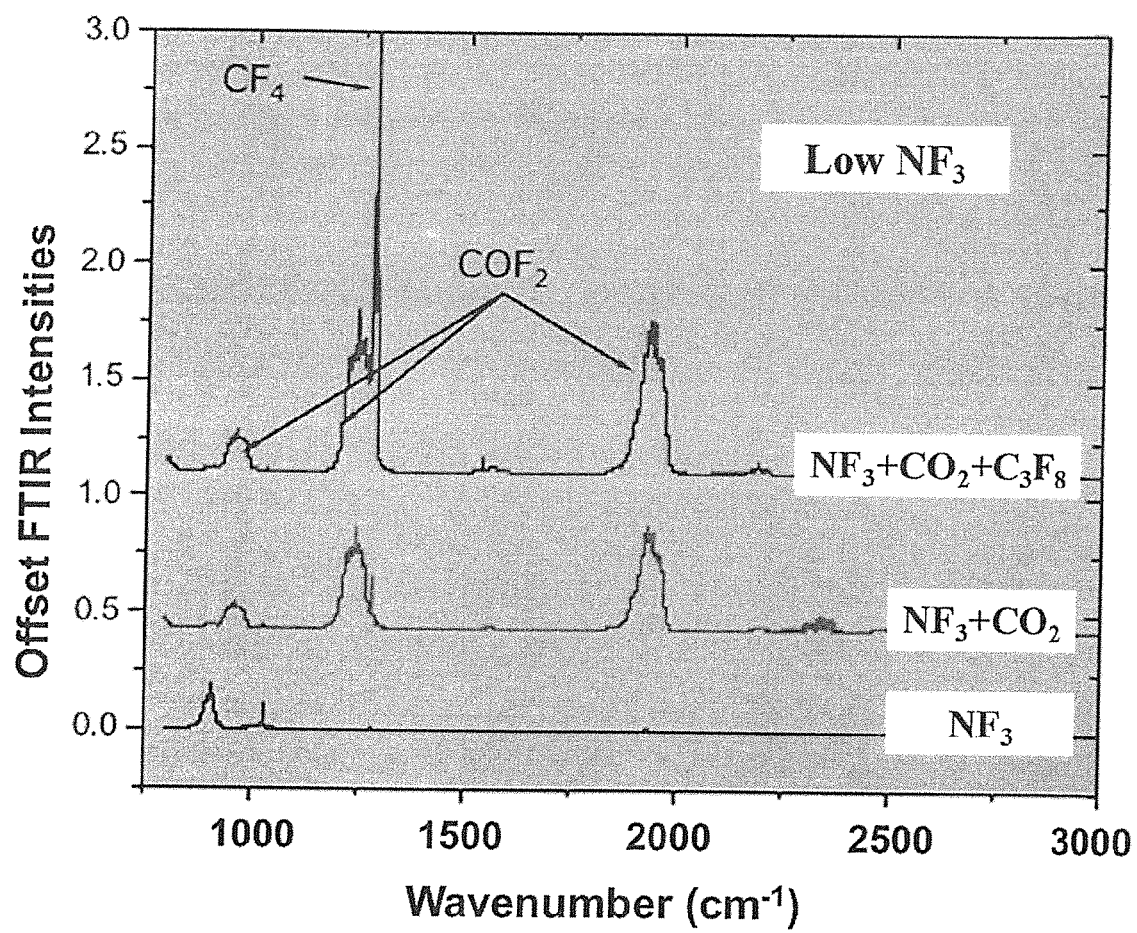
FIG. 19 provides FTIR data comparing Formulation 2 (top line), Formulation 1 (middle line) and pure NF$_3$ (bottom line) when NF$_3$ is low.

The data for Formulation 2; Formulation 1; Pure NF$_3$ Comparison with low flow NF$_3$, are all shown in FIG. 19.
1. Formulation 2→
   a. Primary etchant—COF$_2$
   b. In-situ generation
   c. Higher COF$_2$ generation due to more available F$_2$/molecule in C$_3$F$_8$
   d. Highest etch rate
   e. Higher CF$_4$→inadequate CO$_2$ concentration
   f. CF$_4$ formed from C$_3$F$_8$ breakdown in plasma
2. Formulation 1→
   a. Primary etchant—COF$_2$
   b. Lower etch rate
   c. Lower COF$_2$ generation
   d. Residual CO$_2$ (excess)
   e. CF$_4$ formed from CO$_2$ and NF$_3$ breakdown in plasma
3. Pure NF$_3$→
   a. Primary etchant—F$_2$
   b. Lowest etch rate
   c. No COF$_2$ or CF$_4$ Formulation 2; Formulation 1; Pure NF$_3$ Comparison with high flow NF$_3$ see FIG. 20
1. Formulation 2→
   a. Primary etchant—COF$_2$
   b. In-situ generation
   c. Higher COF$_2$ generation due to more available F$_2$/molecule in C$_3$F$_8$
   d. Highest etch rate
   e. Higher CF$_4$→inadequate CO$_2$ concentration
   f. CF$_4$ formed from C$_3$F$_8$ breakdown in plasma
2, Formulation 1→
   a. Primary etchant—COF$_2$
   b. Lower etch rate
   c. Lower COF$_2$ generation
   d. Residual CO$_2$ (excess)
   e. CF$_4$ formed from CO$_2$ and NF$_3$ breakdown in plasma
3. Pure NF$_3$→
   a. Primary etchant—F$_2$
   b. Lowest etch rate
   c. No COF$_2$ or CF$_4$ Effect of CO$_2$ See FIGS. 21A-21C
1. NF$_3$+C$_3$F only→(see FIGS. 21A and 21B)
   a. Primary etchant—F$_2$, C$_x$F$_y$*
   b. Low etch rate
   c. F$_2$ from NF$_3$ breakdown consumed by C$_x$F$_y$ breakdown to form CF$_4$ leading to low cleaning rates
2. NF$_3$+C$_3$F$_8$+CO$_2$→(see FIG. 21C)
   a. Primary etchant—COF$_2$
   b. In-situ generation Effect of NF$_3$ Flow
1. For same available CO$_2$ and C$_3$F$_8$:
   a. Lower NF$_3$ flow allows for marginally higher COF$_2$ generation
   b. Higher NF$_3$ flow has lower COF$_2$ generation
   c. CF$_4$ generation is similar and negligible compared to COF$_2$ generation.

Figure 22A:
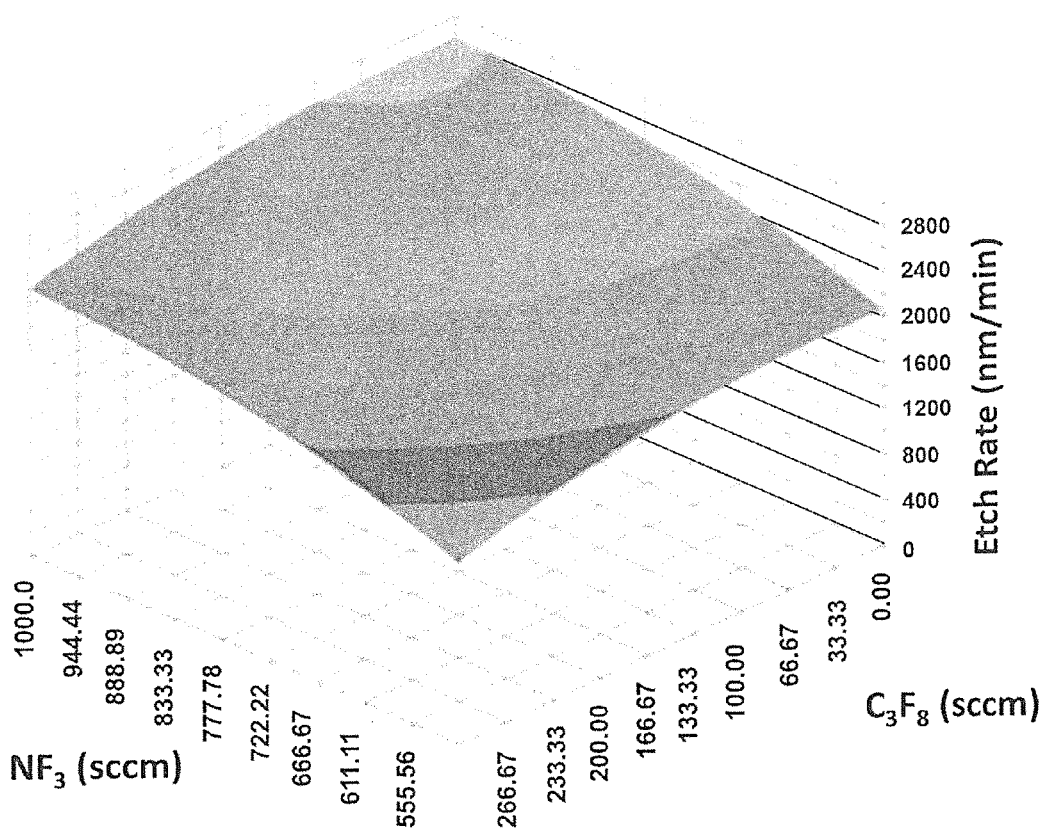
FIG. 22A demonstrates the effect of a high residence time on the etch rate.
Figure 22B:
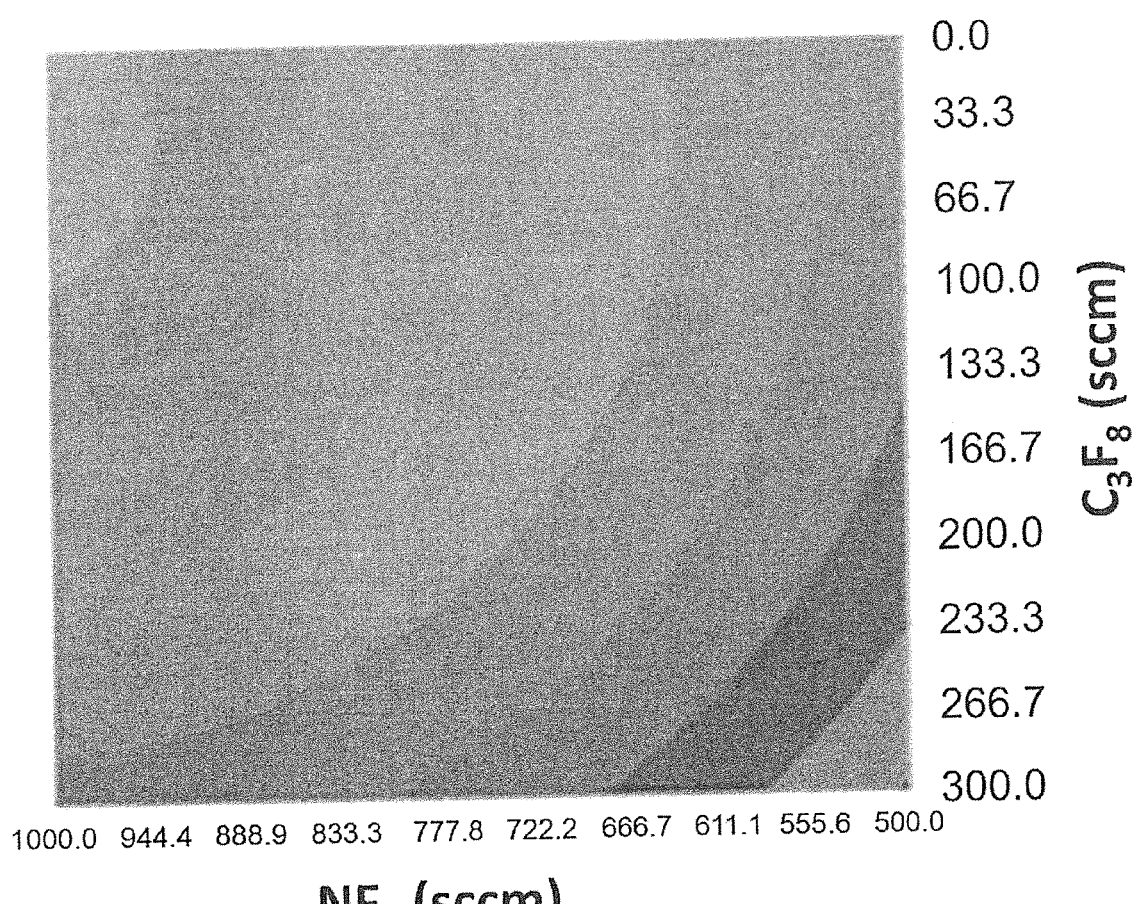
FIG. 22B shows a simplified view of FIG. 22A.
Figure 23A:
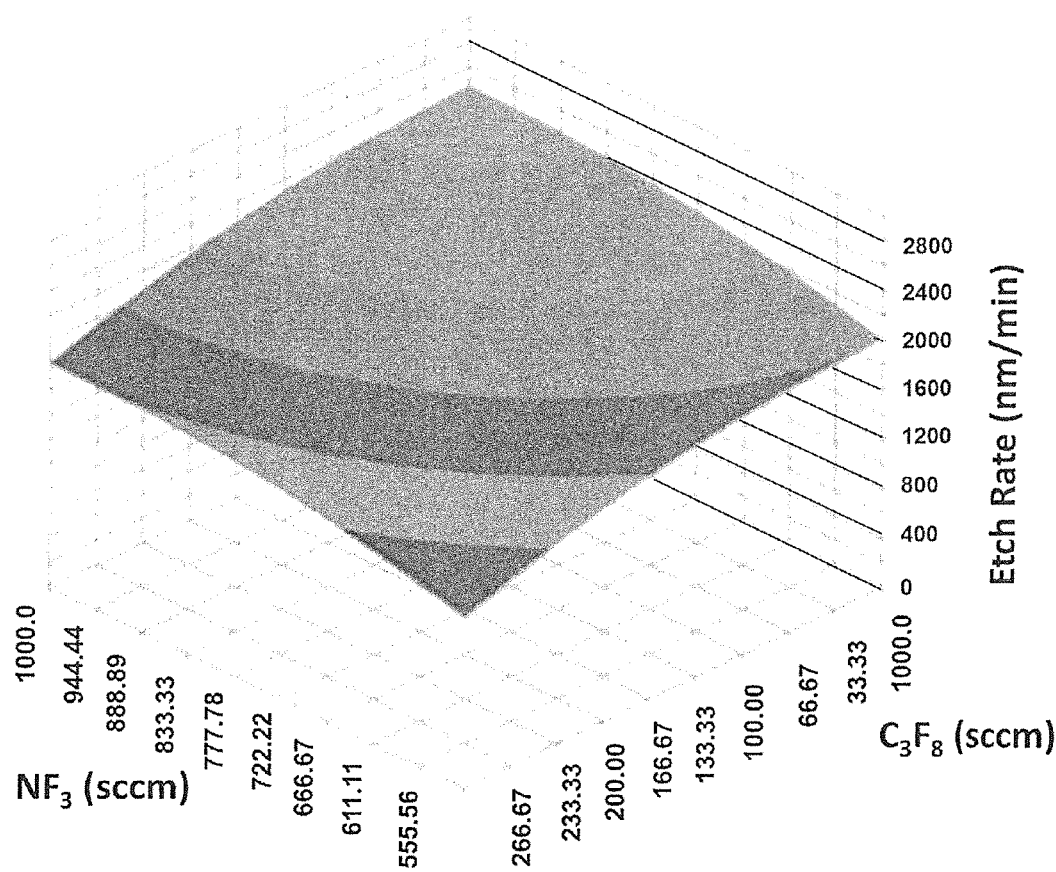
FIG. 23A demonstrates the effect of a low residence time on the etch rate.
Figure 23B:
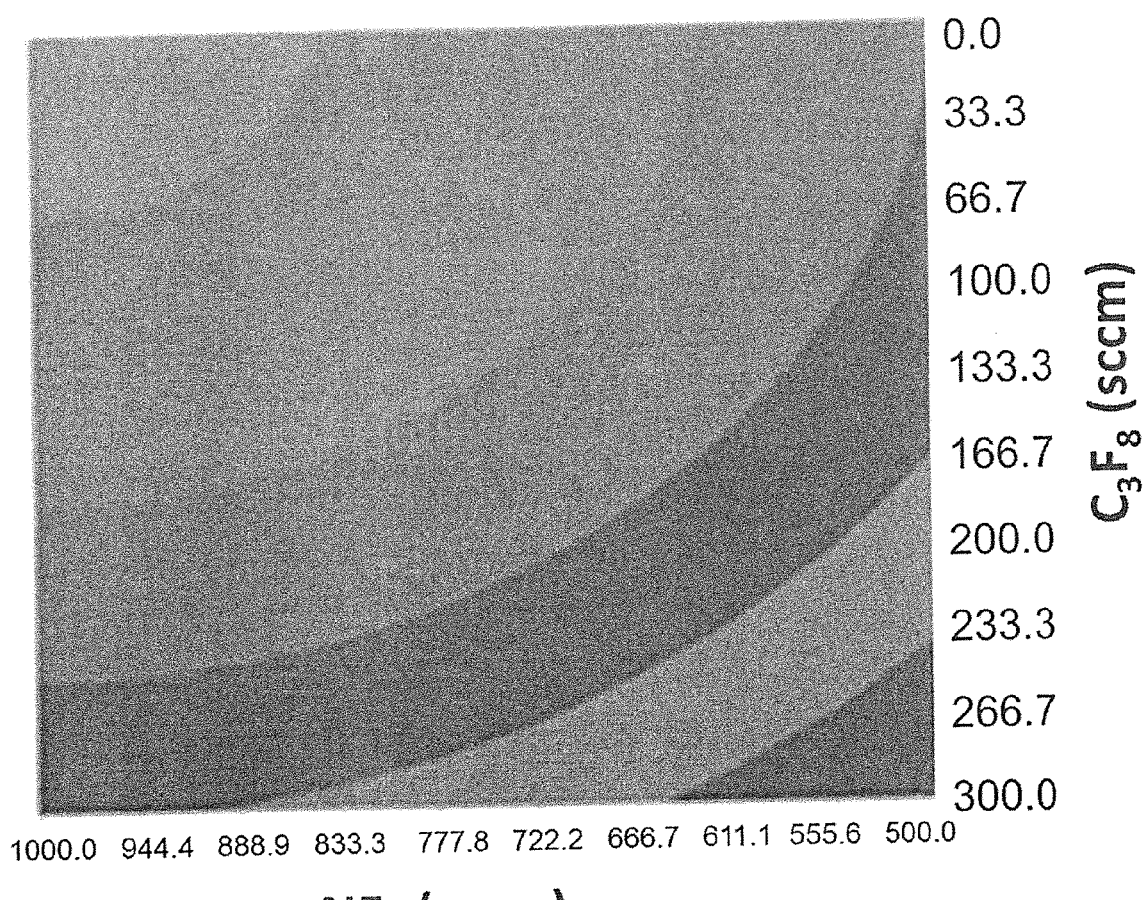
FIG. 23B shows a simplified view of FIG. 23A.

Effect of Residence Time: High Residence Time—Experimental Run 2 See FIGS. 22A and 22B
1. Maximum etch rate of ~2900 nm/min
   a. 940 sccm NF$_3$
   b. 700 sccm CO$_2$
   c. 60 sccm C$_3$F$_8$ Effect of Residence Time: Lower Residence Time—Experimental Run 3 See FIGS. 23A and 23B
   d. Maximum etch rate of ~2400 nm/min in
   e. Reduction of ~20% compared to Higher residence times
   f. Lower residence time=lower COF$_2$ generation As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas (or precursor) may be a combination of two or more gases (or precursors) and may include substances which are normally liquid or solid but temporarily carried along with other "matrix gases" or, synonymously, "carrier gases". Matrix gases or carrier gases may be an "inert gas" which refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of cleaning a material with $COF_2$ produced in-situ, the method comprising:
   igniting and sustaining a nitrogen trifluoride ($NF_3$) plasma;
   introducing into said plasma in a stepwise fashion an oxygen source and a perfluorocarbon compound wherein said oxygen source comprises an oxide of carbon having the formula ($CO_x$) where x is 1 or 2;
   forming $COF_2$ through the dissociation of said $NF_3$, said $CO_x$ and said perfluorocarbon compound; and
   cleaning the material by exposing the material to said formed $COF_2$.

2. The method of claim 1, wherein the material is selected from the group consisting of interior surfaces of a deposition chamber or a substrate.

3. The method of claim 1, wherein said perfluorocarbon compound is selected from the group consisting of $C_3F_8$, $C_4F_8$, $C_2F_6$, and $C_4F_{10}$.

4. The method of claim 1, wherein said perfluorocarbon compound is saturated, unsaturated or partially unsaturated.

5. The method of claim 1, further comprising introducing one or more additives into said plasma, said one or more additives is selected from the group consisting of oxygen, ozone, water, hydrogen peroxide ($H_2O_2$), ethers, ketones, aldehydes, alcohols, carboxylic acids, organic acids, carbonyls, fluorinated compounds, and halogenated compounds.

6. The method of claim 2, wherein said substrate is a support substrate with or without layers formed thereon.

7. The method of claim 6, wherein said support substrate is selected from the group consisting of semiconductor substrates, PV substrates, LED/OLED substrates and MOCVD substrates.

* * * * *